(12) United States Patent
Inoue et al.

(10) Patent No.: US 6,946,931 B2
(45) Date of Patent: Sep. 20, 2005

(54) SURFACE ACOUSTIC WAVE RESONATOR AND SURFACE ACOUSTIC WAVE FILTER

(75) Inventors: Shogo Inoue, Kawasaki (JP); Jun Tsutsumi, Kawasaki (JP); Takashi Matsuda, Kawasaki (JP); Osamu Ikata, Yokohama (JP)

(73) Assignees: Fujitsu Limited, Kawasaki (JP); Fujistu Media Devices Limited, Yokohama (JP)

( * ) Notice: Subject to any disclaimer, the term of this patent is extended or adjusted under 35 U.S.C. 154(b) by 3 days.

(21) Appl. No.: 10/316,089

(22) Filed: Dec. 11, 2002

(65) Prior Publication Data

US 2003/0117240 A1 Jun. 26, 2003

(30) Foreign Application Priority Data

Dec. 21, 2001 (JP) ......................................... 2001-390707

(51) Int. Cl.[7] .............................. H03H 9/64; H03H 9/25
(52) U.S. Cl. ................... 333/195; 333/196; 310/313 B; 310/313 D
(58) Field of Search ................................. 333/193–196; 310/313 R, 313 B, 313 C, 313 D

(56) References Cited

U.S. PATENT DOCUMENTS

| | | | | |
|---|---|---|---|---|
| 5,654,680 A | * | 8/1997 | Kwan et al. | ................. 333/195 |
| 5,729,186 A | * | 3/1998 | Seki et al. | ................... 333/194 |
| 5,874,869 A | * | 2/1999 | Ueda et al. | ................. 333/193 |
| 6,025,763 A | * | 2/2000 | Morimoto | ................... 333/195 |
| 6,121,860 A | * | 9/2000 | Tsutsumi et al. | ........... 333/195 |
| 6,377,138 B1 | * | 4/2002 | Takagi et al. | ................ 333/193 |
| 6,404,101 B1 | * | 6/2002 | Taniguchi et al. | ...... 310/313 A |
| 6,501,208 B1 | * | 12/2002 | Kuroda | ................... 310/313 R |
| 6,522,219 B2 | * | 2/2003 | Takamiya et al. | ........... 333/133 |
| 6,557,225 B2 | * | 5/2003 | Takata et al. | .............. 29/25.35 |
| 6,570,470 B2 | * | 5/2003 | Maehara et al. | ............. 333/193 |

FOREIGN PATENT DOCUMENTS

| | | | | |
|---|---|---|---|---|
| JP | 56-43818 | * | 4/1981 | ................. 333/155 |
| JP | 63-82113 | | 4/1988 | |
| JP | 7-307640 | | 11/1995 | |
| JP | 10-32463 | | 2/1998 | |
| JP | 11-163664 | | 6/1999 | |
| JP | 11-191720 | | 7/1999 | |
| JP | 2002-17679 | * | 8/2002 | |
| WO | WO 99/04489 | * | 1/1999 | |

OTHER PUBLICATIONS

"A Low–Loss Band–Pass Filter Using SAW Resonators", Satoh et al, *Institute of Electronics, Information and Communication Engineers,* vol. J 76–A, No. 2, Feb. 1993, pp. 245–252.

* cited by examiner

*Primary Examiner*—Barbara Summons
(74) *Attorney, Agent, or Firm*—Arent Fox PLLC

(57) ABSTRACT

A surface acoustic wave resonator includes a piezoelectric substrate, and a SAW resonator having an interdigital transducer. The interdigital transducer satisfies $0.15L \leq W \leq 0.45L$ where W is the total of widths of all electrode fingers that form the interdigital transducer, and L is a length of the said interdigital transducer in a direction of SAW propagation.

17 Claims, 25 Drawing Sheets

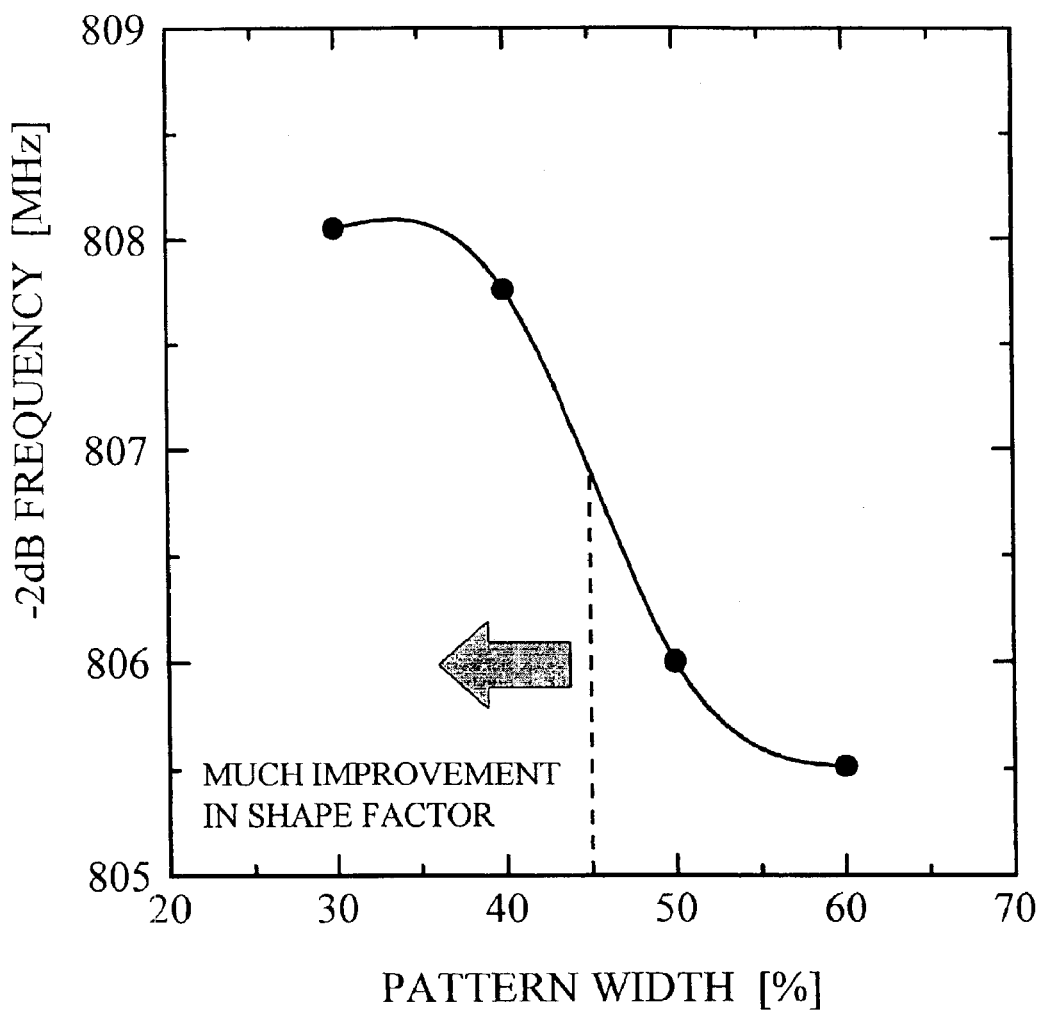

22 21 23

SURFACE ACOUSTIC WAVE RESONATOR AND SURFACE ACOUSTIC WAVE FILTER

CROSS-REFERENCE TO RELATED APPLICATIONS

This application is based on, and claims priority to, Japanese patent application number 2001-390707, filed on Dec. 21, 2001, in Japan, and the entire disclosure of which is incorporated herein by reference.

BACKGROUND OF THE INVENTION

1. Field of the Invention

The present invention generally relates to a surface acoustic wave resonator, a ladder-type surface acoustic wave filter having surface acoustic wave resonators arranged in a series arm and a parallel arm, and a composite type surface acoustic wave filter in which a surface acoustic resonator is combined with a double mode type surface acoustic filter or the like.

2. Description of the Related Art

A ladder-type surface acoustic wave (SAW) filter having a plurality of SAW resonators is known as a band-pass filter (see Transaction A of the Institute of Electronics, Information and Communication Engineers, Vol. J 76-A, No.2, 1993, pp. 245–252).

FIG. 1 shows a conventional ladder-type SAW filter. The filter includes a piezoelectric substrate 10 on which SAW resonators S1 and S2 are respectively arranged in series arms between an input terminal Ti and an output terminal To and SAW resonators P1 and P2 are respectively arranged in parallel arms. One of the parallel arms is provided between the input terminal Ti and ground G, and the other parallel arm is provided between the node between the SAW resonators S1 and S2 are connected and ground G. Each of the SAW resonators S1, S2, P1 and P2 is called one-port SAW resonator.

FIG. 2 illustrates a structure of the one-port SAW resonator. The one-port SAW resonator includes an interdigital transducer (hereinafter simply referred to as IDT) 11 and two reflectors 12 and 13, all of which are formed on the piezoelectric substrate 10. The IDT 11 electrically excites a SAW. The reflectors 12 and 13 are positioned on SAW propagation paths and act as confine the SAWs excited by the IDT 11. In case where a desired resonance characteristic is obtained by utilizing internal reflection of SAW by the IDT 11 alone, the reflectors 12 and 13 may be omitted.

The IDT 11 has a pair of comb electrodes, each of which has a number of electrode fingers arranged with a fixed period Pi. Each of the reflectors 12 and 13 has a number of grating electrodes arranged with a fixed period pr, and is called grating reflector.

A pair of adjacent electrode fingers respectively extending upwards and downwards forms a unit for excitation of SAW. An electrode arrangement having two electrode fingers within one period pi is called single electrode or single electrode arrangement.

When one electrode finger of the single electrode arrangement has a width w, this electrode finger has a pattern width of 2w/pi×100(%). When the electrode finger width w is equal to a space width s between the adjacent electrode fingers (w=s) as shown in FIG. 2, the pattern width is 50%. An average pattern width means the average of the pattern widths of all the electrode fingers that form the IDT.

Generally, the electrode fingers that form the IDT 11 of the one-port SAW resonator are designed to have a pattern width of 50% for the purpose of reducing the resistance of the electrode fingers and the amount of frequency shift dependent on variation in the pattern width introduced during the production process.

FIG. 3A shows a frequency characteristic of the conventional SAW resonator mentioned above. Generally, the SAW resonator has properties of dual resonance that has a resonance frequency fr and an anti-resonance frequency fa. An arrangement having SAW resonators connected in series acts as a low-pass filter, as shown by a solid line in FIG. 3A. In series connection, insertion loss is minimized at a resonance frequency frs and is maximized at an anti-resonance frequency fas. An arrangement having SAW resonators connected in parallel acts as a high-pass filter, as shown by a broken line in FIG. 3A. In parallel connection, the insertion loss is maximized at a resonance frequency frp and is minimized at an anti-resonance frequency fap.

The ladder-type SAW filter is made up of SAW resonators S1 and S2 arranged in series arms and SAW resonators P1 and P2 arranged in parallel arms, as shown in FIG. 1. Therefore, a band-pass filter having a pass band as shown in FIG. 3B is available by designing the IDTs of the SAW resonators so that the anti-resonance frequencies fap of the SAW resonators P1 and P2 are approximately equal to the resonance frequencies frs of the SAW resonators S1 and S2.

FIG. 4 shows required band characteristics of the band-pass filter such as the ladder-type SAW filter. The characteristics can be described by desired bandwidths (BW1, BW2), the degrees of suppression (ATT1, ATT2) at frequencies defined in the specification, and the widths of the suppressed ranges (BWatt1, BWatt2). Further, the characteristics can be evaluated by a shape factor that describes the ratio of the bandwidth BW1 at a given attenuation to the bandwidth BW2 at another given attenuation (BW1/BW2). The filter characteristics become better as the shape factor becomes closer to 1.

The shape factor of the ladder-type SAW filter may be improved by sharpening the transition slopes that connect the attenuation ranges and the pass-band range. The sharpness of the transition slopes is almost determined by a difference Δf between the resonance frequency fr and the anti-resonance frequency fa of the SAW filter. Decreasing the frequency difference Δf sharpens the transition slopes. Various methods for decreasing the frequency difference Δf have been proposed (for example, Japanese Unexamined Patent Publication No. 11-163664). As shown in FIG. 5, the falling slope can be sharpened by reducing the difference Δfs between the resonance point and anti-resonance point of the SAW resonator in the series arm, so that the shape factor can be improved.

However, the methods for reducing the frequency difference Δf to thereby sharpen the transition slopes reduce the pass-band width of SAW passage. Therefore, there is a tradeoff relationship between improvement in the shape factor and expansion of the pass-band width and there is difficulty in achieving concurrent improvements.

SUMMARY OF THE INVENTION

It is a general object of the present invention to provide a SAW resonator and a SAW filter in which the above problems are eliminated.

A more specific object of the present invention is to provide a SAW resonator and a SAW filter having an improved shape factor and an expanded pass-band width.

The above objects of the present invention are achieved by a surface acoustic wave resonator comprising: a piezoelectric substrate; and an acoustic wave (SAW) resonator having at least one interdigital transducer, wherein said at least one interdigital transducer satisfies:

$$0.15L \leq W \leq 0.45L$$

where W is the total of widths of all electrode fingers that form said at least one interdigital transducer, and L is a length of said at least one interdigital transducer in a direction of SAW propagation.

The above objects of the present invention are also achieved by A surface acoustic wave filter comprising: a piezoelectric substrate; and surface acoustic wave (SAW) resonators that are formed on the piezoelectric substrate and are electrically connected in series, each of the SAW resonators having at least one interdigital transducer configured as described above.

The above objects of the present invention are also achieved by a surface acoustic wave filter comprising: a piezoelectric substrate; and surface acoustic wave (SAW) resonators that are formed on the piezoelectric substrate and are electrically connected in series, the SAW resonators including a SAW resonator having at least one interdigital transducer configured as mentioned above.

The above objects of the present invention are also achieved by a surface acoustic wave filter comprising: a double mode type surface acoustic wave (SAW) filter and a SAW resonator electrically connected thereto, said SAW resonator comprising a piezoelectric substrate, and an acoustic wave (SAW) resonator having at least one interdigital transducer configured as mentioned above.

BRIEF DESCRIPTION OF THE DRAWINGS

Other objects, features and advantages of the present invention will become more apparent from the following detailed description when read in conjunction with the accompanying drawings, in which:

FIG. 11 is a graph of a −2 dB frequency as a function of the pattern width in FIGS. 10A and 10B;

DESCRIPTION OF THE PREFERRED EMBODIMENTS

The present invention reduces insertion loss in an end of the pass band of a SAW filter on the basis of a novel viewpoint described below, so that the shape factor can be improved without reducing the pass-band width of the filter. The present invention reduces the insertion loss between the resonance point and anti-resonance point of the SAW filter.

Figure 6:
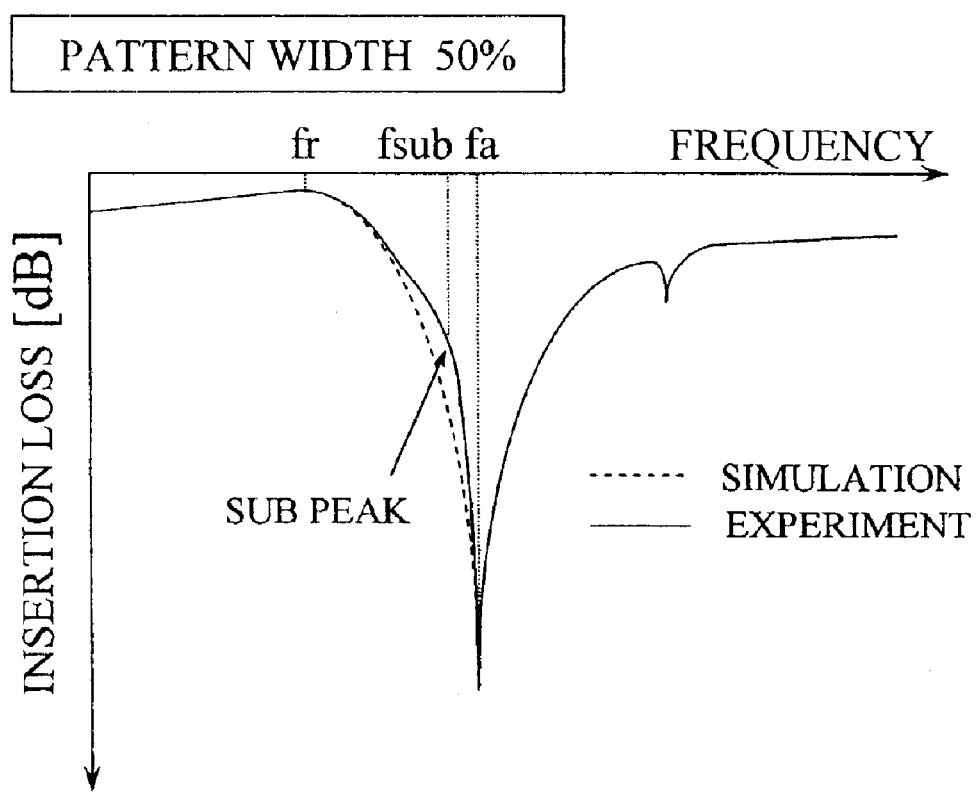
FIG. 6 is a graph of a frequency characteristic of conventional one-port SAW resonators connected in series.

FIG. 6 shows a pass-band characteristic of a SAW filter having conventional one-port SAW resonators that have a pattern width of 50% and are connected in series. A solid line shown in FIG. 6 shows an experimental result, and a broken line shows a simulation result. The simulation used the general coupling-of-modes theory.

The inventors compared the solid and broken lines with each other, and found out that the experimental result does not coincide with the simulation result very well in a section located between the resonance point and the anti-resonance point. More particularly, there is a second peak different from the peak due to resonance between the resonance point and the anti-resonance point. Hereinafter, such a second peak is referred to as sub peak. The inventors found out that the pass band has a reduced insertion loss in the sub peak position.

The simulation that uses the coupling-of-modes theory cannot reproduce the sub peak. This suggests that the coupling-of-modes theory is a one-dimensional analysis method for the direction of SAW propagation and the sub peak could not be explained without considering two-dimensional or three-dimensional behaviors of SAW.

The inventors paid attention to the sub peak and considered a way of improving the shape factor of the SAW filter due to the sub peak. The inventors attempted to reduce insertion loss in an end portion of the pass band. In the conventional resonator structure, the sub peak is located far from the resonance point and is thus buried in the transition range. The inventors attempted to move the sub peak close to the resonance point to thereby improve the shape factor.

Figure 7:
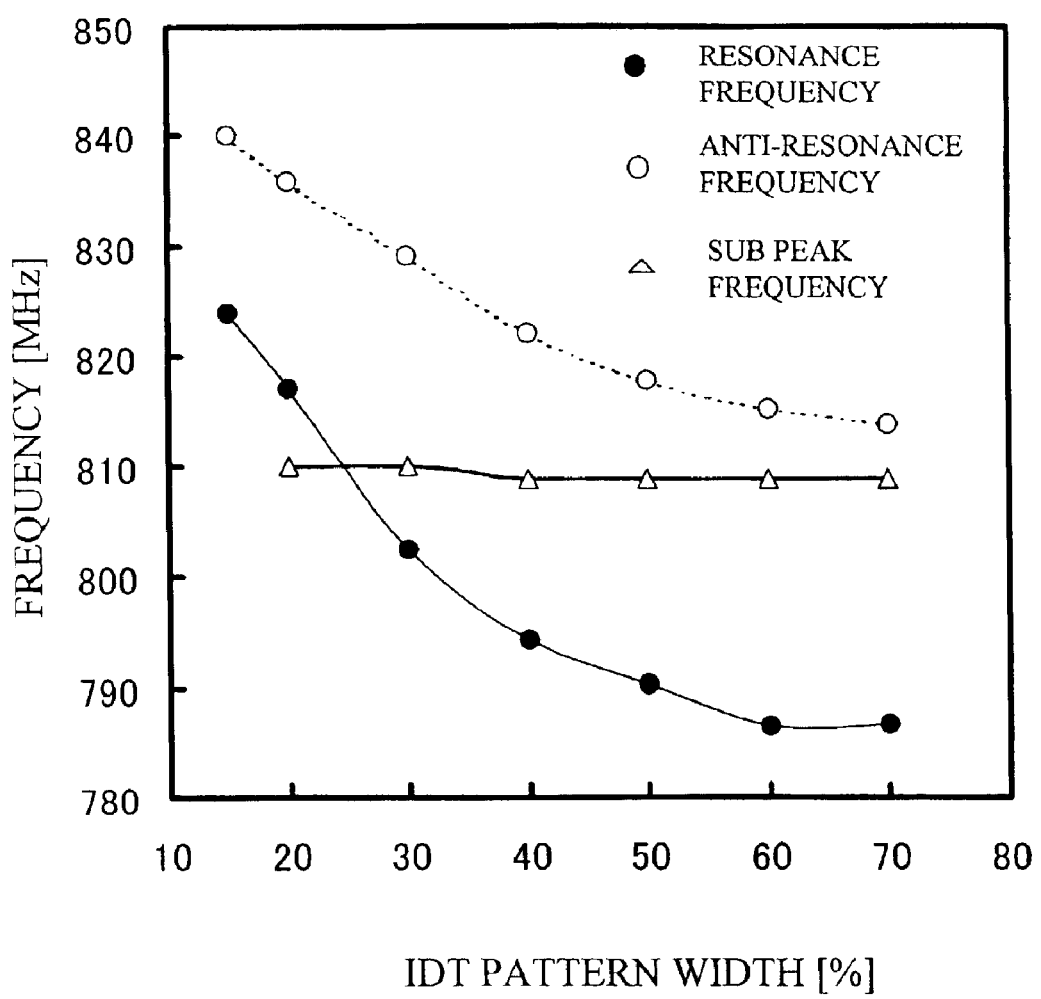
FIG. 7 is a graph illustrating variations in the resonance frequency, anti-resonance frequency and sub peak frequency as a function of the pattern width of the IDT.

The inventors conducted experiments in which only the pattern width of the IDT was changed while the electrode finger period of the IDT was kept constant. The results of the experiment are shown in FIG. 7. The horizontal axis of the graph of FIG. 7 denotes the pattern width (%), and the vertical axis thereof denotes the frequency at which the sub peak is observed. The inventors found out from the graph that changing the IDT pattern width varies the resonance frequency and the anti-resonance frequency, but does not vary the sub-peak frequency.

More particularly, the inventors found out from the experiments that the resonance point and the sub peak relatively come close to each other by narrowing the pattern width so as to be lower than 50%, so that the resonance frequency can be raised. The inventors found out from the experimental results that an IDT pattern width of 35% is most suitable for bringing the position of the sub peak into line with a right shoulder portion of the filter characteristic.

As has been described with reference to FIG. 2, the pattern width is defined as 2w/pi×100(%), and is the sum of the widths of two electrode fingers included in one period pi. Thus, narrowing the pattern width so as to be lower than 50% in the SAW resonator means that the pattern width for each pair of electrode fingers within one period is narrower than 50%. In this case, even when the pattern widths for the pairs of electrode fingers may be identical to or different from one another, the resonance point and the sub peak relatively come close to each other. Further, the inventors found out that, when the average pattern width of the entire IDT is lower than 50%, the resonance point and the sub peak relatively come close to each other. That is, the resonance point and the sub peak relatively come close to each other when W/L is lower than 50% where W is the total of the widths of all the electrode fingers that form the IDT and L is the length of the IDT in the direction of SAW propagation. From the above viewpoints, the pattern width of the present invention means the average pattern width unless special comments are given. The conditions for setting the pattern width narrower than 50% will be described later.

Figure 8:
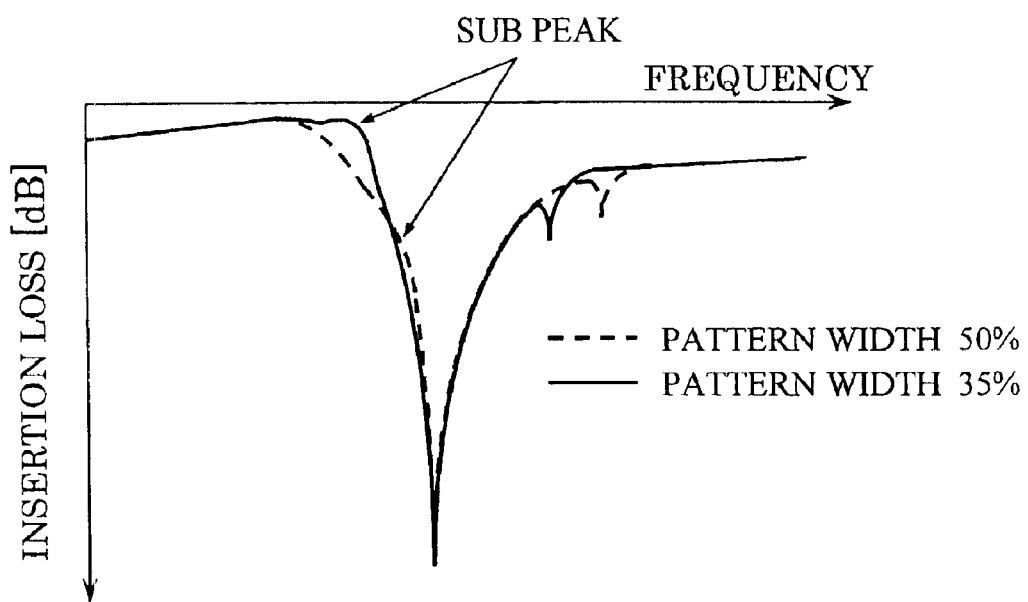
FIG. 8 is a graph illustrating an improvement in the shoulder shape of the pass band due to shift of the sub peak.

FIG. 8 comparatively shows pass band characteristics of two SAW resonators that have pattern widths of 50% and 35%, respectively. The graph of FIG. 8 is depicted so that the resonance points of the SAW resonators coincide with each other. The SAW resonator with a pattern width of 35% has an improved shoulder shape and a sharper falling end because the sub peak thereof is made close to the resonance point.

Figure 9:
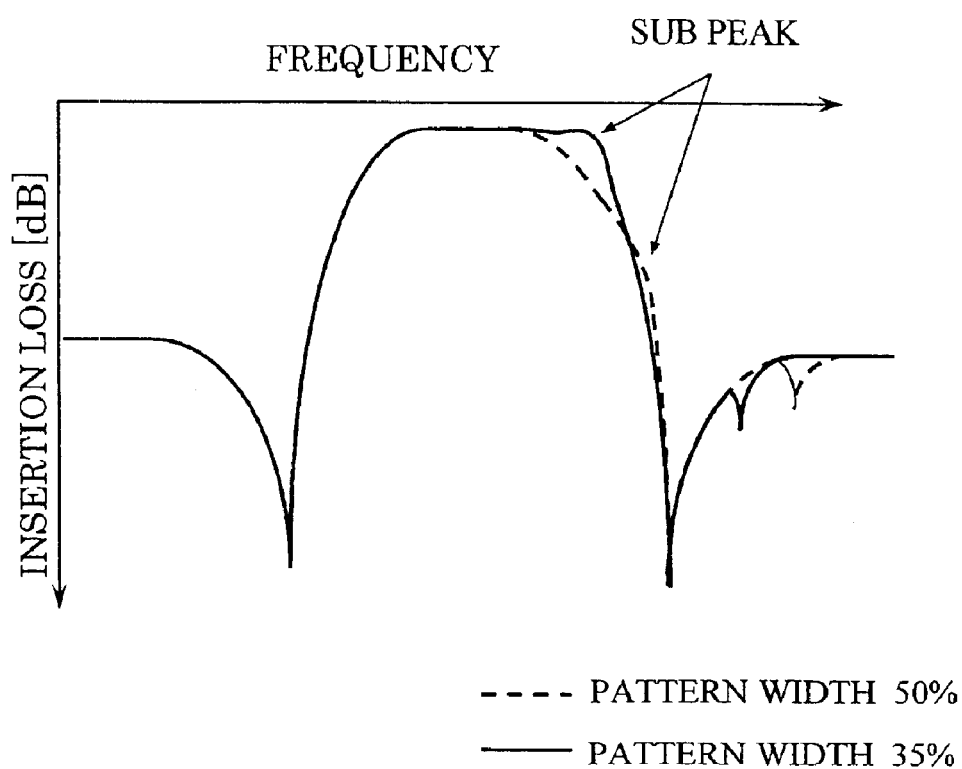
FIG. 9 is a graph of a frequency characteristic of a ladder type SAW filter in which SAW resonators having a pattern width of 35% are applied to series arms of the filter.

FIG. 9 shows a band pass characteristic of a ladder type SAW filter in which SAW resonators in series arms have a pattern width of 35%. As has been pointed out previously, the conventional ladder type SAW filter equipped with SAW resonators having a pattern width of 50% has the sub peak far from the resonance point and is buried in the transition range. In contrast, the ladder type SAW filter equipped with the series-arm SAW resonators having the pattern width equal to 35% has the sub peak close to the resonance point so that the right shoulder portion of the filter characteristic has a less insertion loss, this resulting in a broader pass band. Further, the falling end of the filter characteristic is sharpened as compared to the conventional filter, so that the shape factor can be improved drastically.

For a pattern width in the range of 25% to 45%, improvements in the shoulder shape due to the shift of the sub peak can be remarkably observed. That is, according to one aspect of the present invention, the following condition is satisfied:

$$0.25L \leq W \leq 0.45L$$

where W is the total of the widths of all the electrode fingers that form the IDT and L is the length of the IDT in the direction of SAW propagation. In other words, improvements in the shoulder shape due to the shift of the sub peak can be provided when the following stands:

$$25\% \leq wa \leq 45\%$$

where wa is the pattern width of the electrode fingers that form the IDT of the single electrode arrangement. If the pattern width is lower than 25%, the frequency of the sub peak is lower than the resonance frequency, and sufficient improvement in the shape factor due to the shift of the sub peak will not be obtained. The reason why the pattern width is set equal to or lower than 45% is as follows.

Figure 10A:
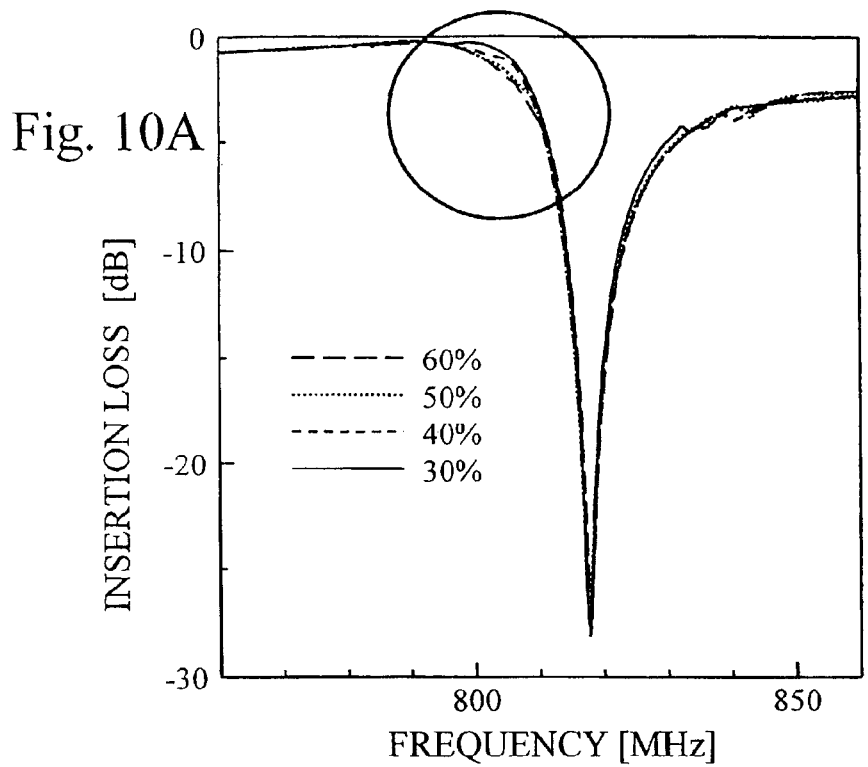
FIGS. 10A and 10B are graphs illustrating variations in the frequency characteristics observed when the pattern width is changed.
Figure 10B:
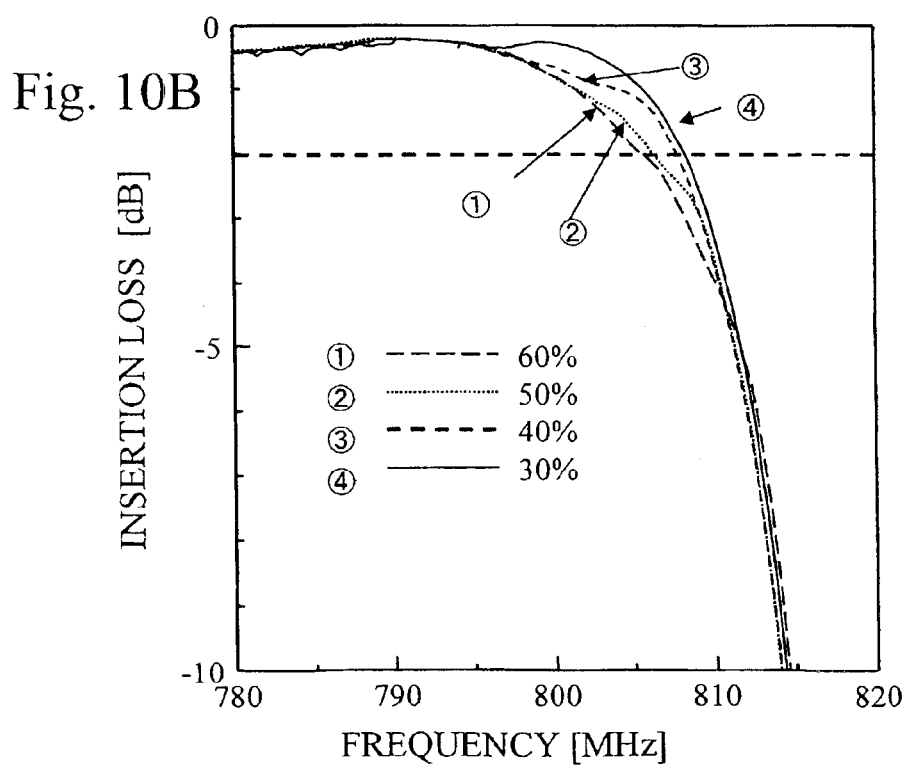

FIGS. 10A and 10B show band pass characteristics of SAW resonators respectively having different pattern widths. The graphs of FIGS. 10A and 10B are illustrated so that the anti-resonance frequencies of the SAW resonators coincide with each other. The graph of FIG. 10B is an enlarged view of a portion surrounded with a cycle shown in FIG. 10A. As shown in FIGS. 10A and 10B, the sub peak comes closer to the resonance point and the shoulder shape is much more improved as the pattern width becomes narrower.

FIG. 11 is a graph showing the frequency at which an insertion loss of −2 dB is obtained as a function of the pattern width in the pass bands shown in FIGS. 10A and 10B. In practice, the value of insertion loss for defining the bandwidth is about −2 dB. FIG. 11 is obtained by plotting the frequencies for an insertion loss of −2 dB as a function of the pattern width in the graph of FIGS. 10A and 10B. A broader pass band range can be obtained and a higher shape factor can be realized as the −2 dB frequency shown along the vertical axis of the graph is higher. It can be seen from FIG. 11 that the −2 dB frequency raises abruptly when the pattern width is 45% or lower. It follows that the SAW filter having a broader pass band range and an improved shape factor can be realized by setting the pattern width equal to or lower than 45%.

Turning to FIG. 7 again, the frequency difference Δf between the resonance frequency and the anti-resonance frequency is comparatively small when the pattern width is lower than 25%, so that the transition slope of the filter can be sharpened. Therefore, it can be said that the shape factor can be improved for a pattern width lower than 25%. When the pattern width is set lower than 15%, the resistance of the electrode fingers may increase and the insertion loss of the filter may also increase.

Figure 12:
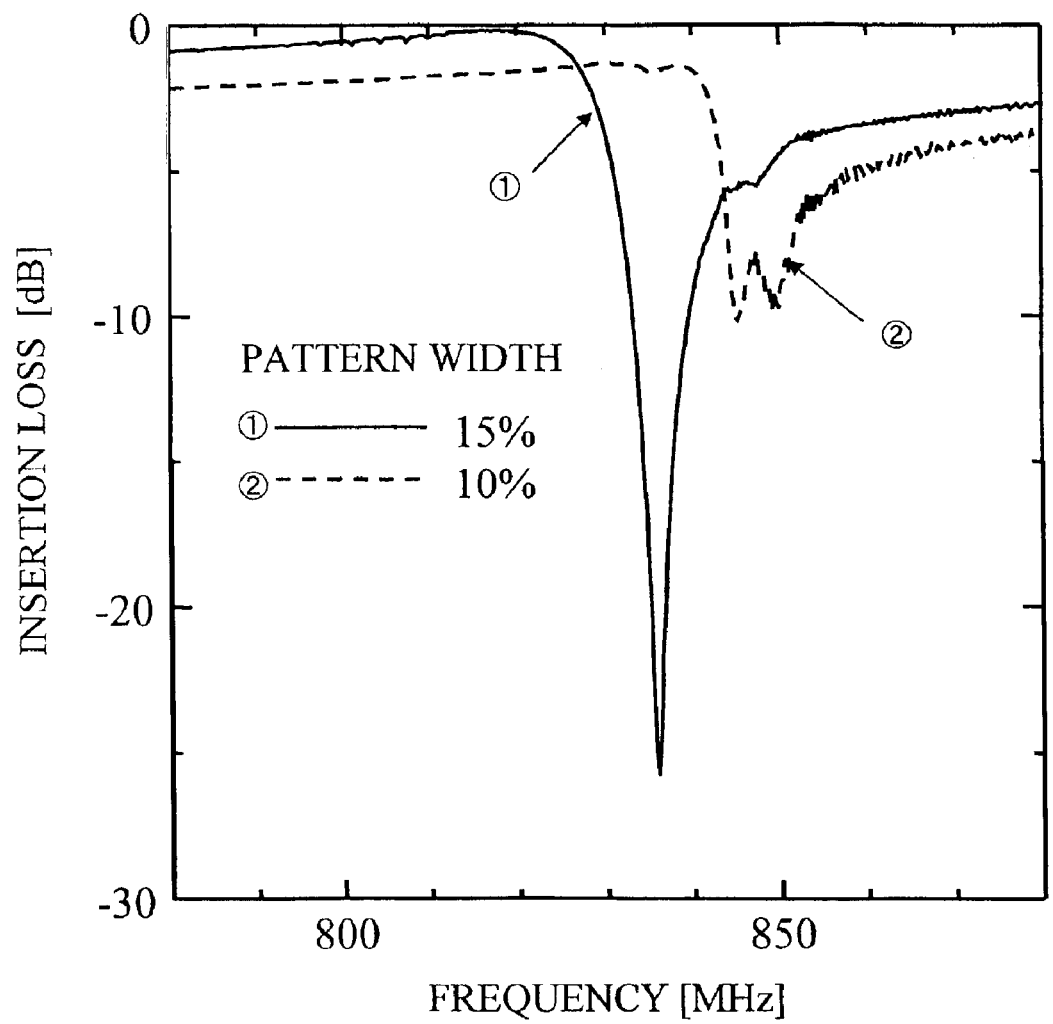
FIG. 12 is a graph of frequency characteristics of two SAW resonators that have pattern widths of 15% and 10%, respectively.

This is illustrated in FIG. 12, which show pass band characteristics of SAW resonators respectively having pattern widths of 15% and 10%. As the pattern width is narrowed, the resistance of the electrode fingers increases and the insertion loss at the resonance frequency increases. For a pattern width of 10%, the insertion loss is as large as 1.3 dB. Further, the stop-band width formed by the IDT is extremely narrow, which greatly degrades the Q value at the anti-resonance frequency. Consequently, the lower limit of the pattern width at which the shape factor can still be improved is 15%.

As a result of the above consideration, the pattern width of the IDT that contributes to improving the shape factor should satisfy the following condition:

$$0.15L \leq W \leq 0.45L.$$

In short, when the pattern width wa of the electrode fingers that form the IDT of the single electrode arrangement satisfies $25\% \leq wa \leq 45\%$, improvements in the shape factor due to the shift of the sub peak can be obtained. When the pattern width wa meets $15\% \leq wa \leq 25\%$, improvements in the shape factor due to the reduced frequency difference Δf between the resonance frequency and the anti-resonance frequency can be obtained. The electrode fingers of the IDT may have an identical pattern width or a different pattern width.

A description will now be given of some structures of the SAW resonator according to an aspect of the present invention.

Figure 13:
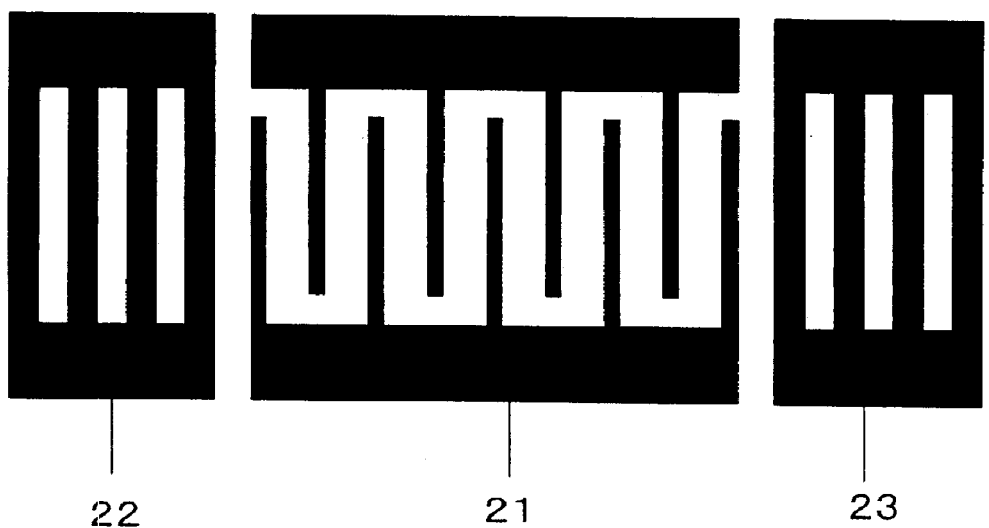
FIG. 13 illustrates a structure of a one-port SAW resonator according to an embodiment of the present invention.

FIG. 13 shows a structure of the SAW resonator according to an embodiment of the present invention. The resonator shown in FIG. 13 has an IDT 21 of a single electrode arrangement. All the electrode fingers of the IDT 21 may have an identical pattern width or a different pattern width. The average pattern width of the IDT 21 falls within the range of 15% to 45%. The IDT 21 shown in FIG. 13 has the electrode fingers, all of which have an identical pattern width. Grating reflectors 22 and 23 may be arranged at both sides of the IDT 21 so as to be spaced apart therefrom.

Figure 14:
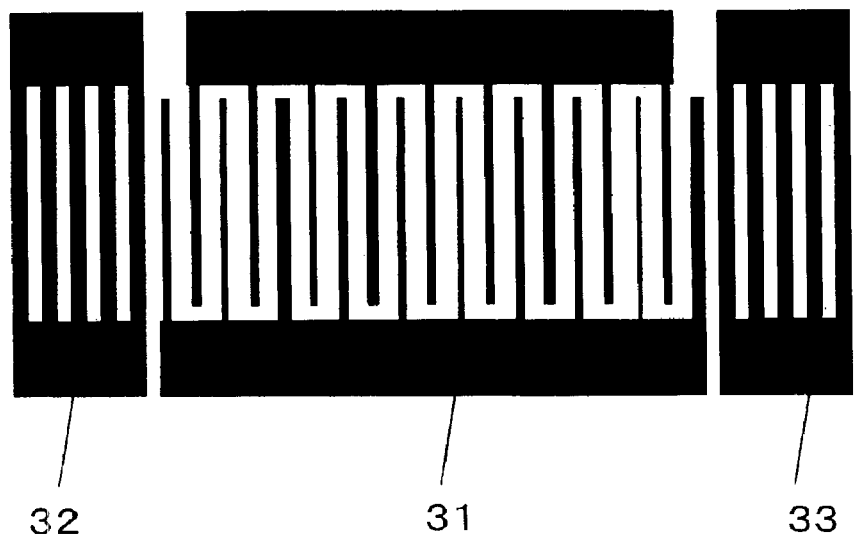
FIG. 14 illustrates a SAW resonator equipped with electrode fingers having different pattern widths according to another embodiment of the present invention.

FIG. 14 shows another structure of the SAW resonator according to another embodiment of the present invention. The SAW resonator in FIG. 14 has an IDT 31 and resonators 32 and 33 arranged at both sides of the IDT 31. The IDT 31 has different pattern widths. It is not required that all the electrode fingers have an identical pattern width but is required that the average pattern width of the IDT 31 falls within the range of 15% to 45%. It is to be noted that the characteristics of the SAW resonator do not depend on the ratio of the minimum pattern width to the maximum pattern width but the average pattern width.

Some variations of the above-mentioned SAW resonators are described below.

Figure 15A:
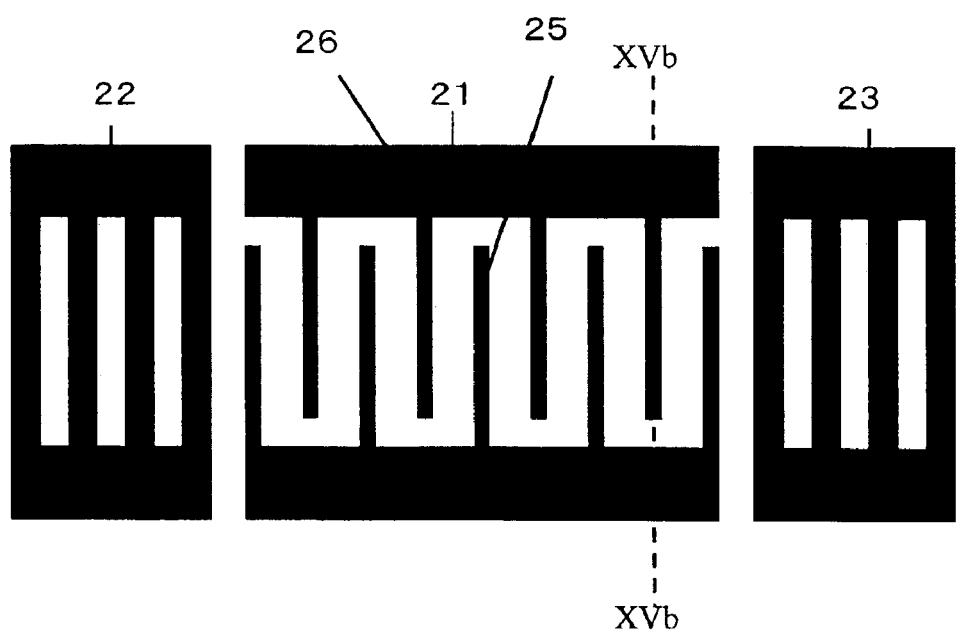
FIG. 15A is a plan view of a SAW resonator in which bus bars of an IDT formed by a metal film are thicker than electrode fingers.
Figure 15B:
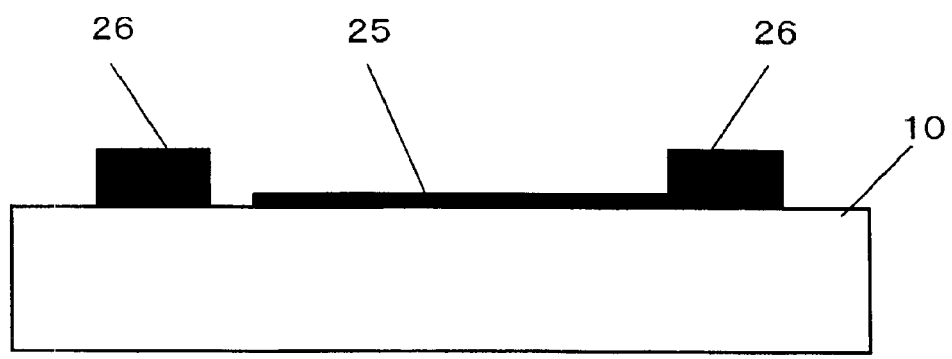
FIG. 15B is a cross-sectional view taken along a line XVb—XVb shown in FIG. 15A.

As shown in FIGS. 15A and 15B, the thickness of a metal forming a bus bar 26 that is part of the IDT 21 may be thicker than that of the electrode fingers 25. As the bus bar 26 made of metal is thicker, the velocity of SAW propagated beneath the bus bar 26 decreases. For a piezoelectric substrate having a recess reverse velocity surface, a waveguide mode of SAW is formed within the resonator. As a result, the SAW in the transverse direction (orthogonal to the direction of SAW propagation) is confined more effectively, so that the insertion loss can further be improved between the resonance point and the anti-resonance point.

Figure 16A:
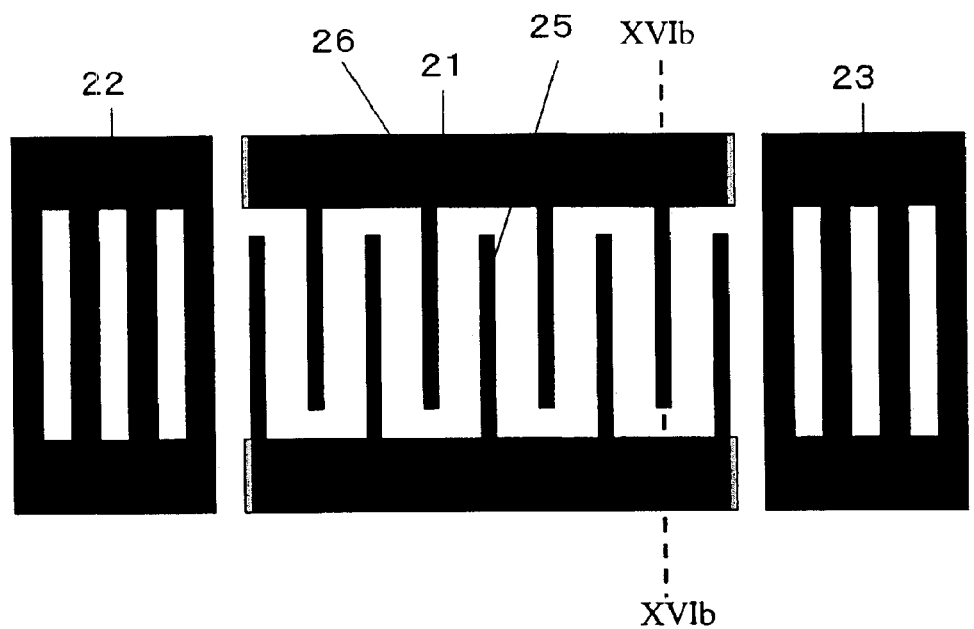
FIG. 16A is a plan view of a SAW resonator in which a dielectric film is provided on bus bars.
Figure 16B:
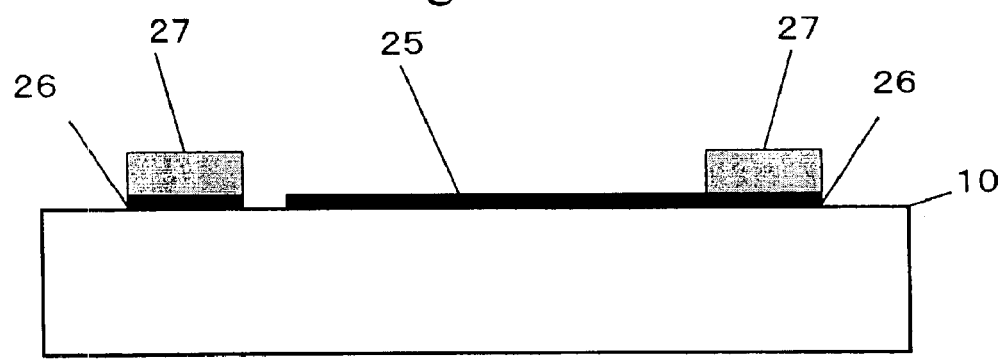
FIG. 16B is a cross-sectional view taken along a line XVIb—XVIb shown in FIG. 16A.

As shown in FIGS. 16A and 16B, dielectric films 27 may be formed on the bus bars 26. The waveguide mode can be formed in the same principle as that for the arrangement shown in FIGS. 15A and 15B, so that the insertion loss can further be improved between the resonance point and the anti-resonance point.

Figure 17A:
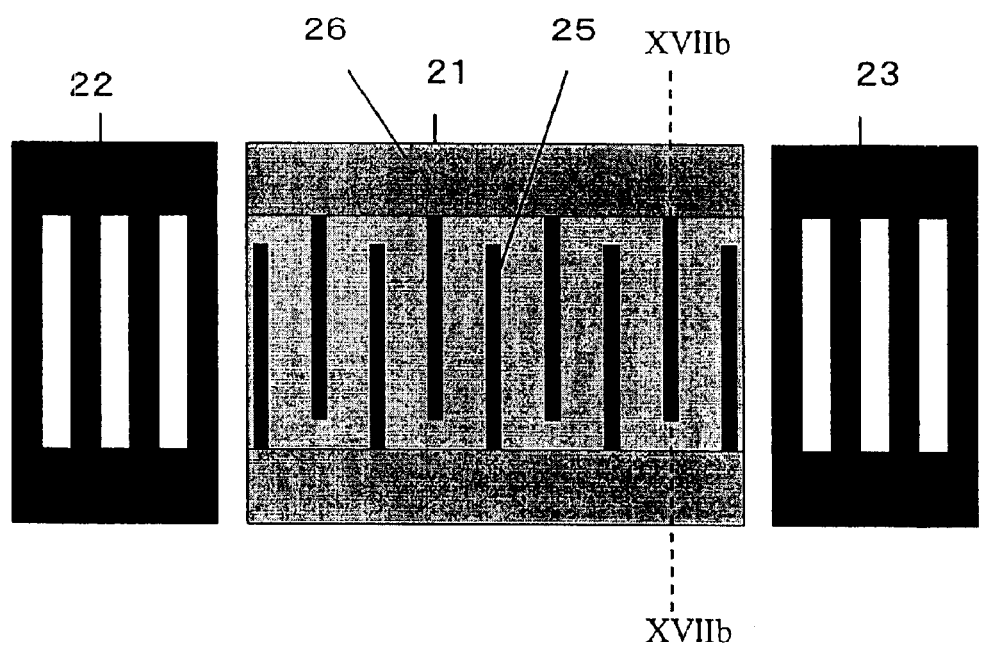
FIG. 17A is a plan view of a SAW resonator in which a dielectric film provided on bus bars is thicker than that provided on electrode fingers.
Figure 17B:
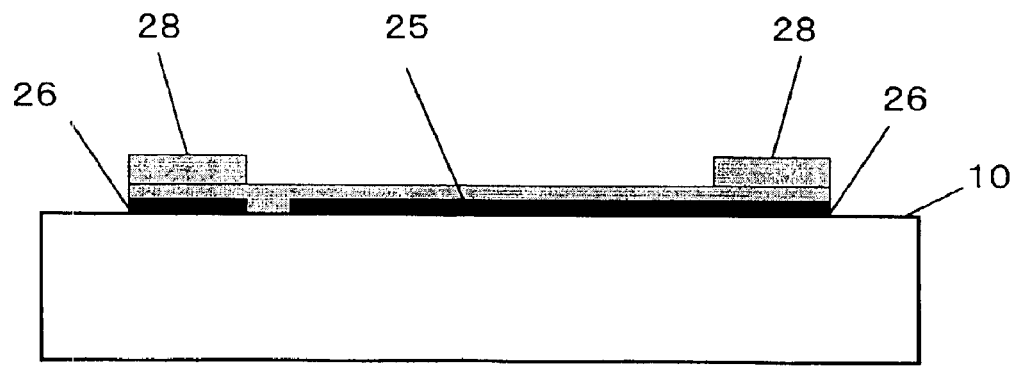
FIG. 17B is a cross-sectional view taken along a line XVIIb—XVIIb shown in FIG. 17A.

As shown in FIGS. 17A and 17B, a dielectric film 28 may be formed on the IDT 21 so as to cover the bus bars 26 and the electrode fingers 25, wherein the dielectric film 28 on the bas bars 26 is thicker than that on the electrode fingers 25. This results in the waveguide mode for the same reason as that for the arrangements shown in FIGS. 15A–15B and 16A–16B. Thus, the insertion loss can further be improved between the resonance point and the anti-resonance point.

The arrangements shown in FIGS. 15A–15B, 16A–16B and 17A–17B may be applied to the bus bars of the reflectors 22 and 23. This application decreases the SAW velocity beneath the bus bars of the reflectors 22 and 23, and results in the waveguide mode on the reflectors 22 and 23. Thus, the insertion loss can further be improved between the resonance point and the anti-resonance point.

Figure 18:
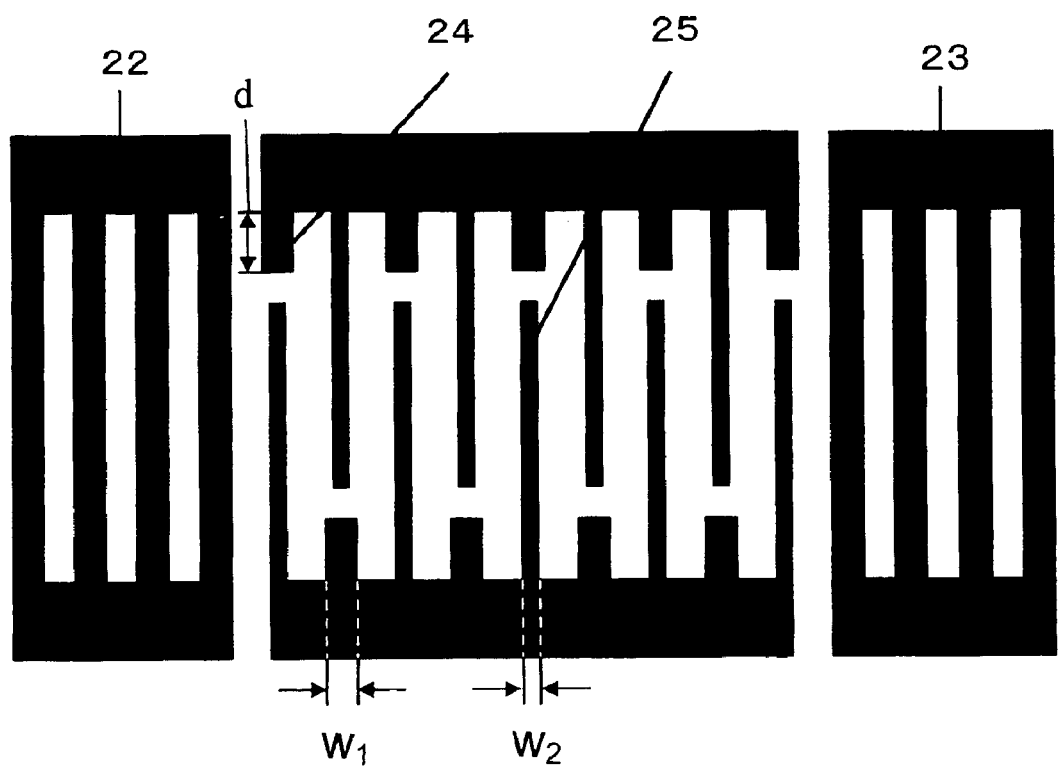
FIG. 18 illustrates another structure of the one-port SAW resonator according to an embodiment of the present invention.

As shown in FIG. 18, dummy electrode fingers 24 having a length d may be provided so as to face the ends of the electrode fingers 25. The dummy electrode fingers 24 are not involved in SAW excitation. The dummy electrode fingers 24 form the waveguide mode of SAW, and the excited SAW is confined in the resonator more effectively. Thus, the shoulder shape can further be improved. The dummy electrode fingers may be applied to the IDT 31 shown in FIG. 14.

Preferably, a width $w_1$ of one electrode finger of the dummy electrode fingers 24 provides a pattern width wd that satisfies the following:

$$wa < wd < 70\%$$

where wa is the pattern width of one electrode finger of the electrode fingers 25, having a width $w_2$, for SAW excitation. For wd<wa, it is difficult to develop the waveguide mode of SAW in the IDT 21. Further, some SAW may leak to the outside of the IDT 21 and the insertion loss may increase. For 70%<wd, the space between the dummy electrode fingers 24 and the excitation electrode fingers 25 is too narrow to produce these electrode fingers lithographically.

It is preferable that the length d of the dummy electrode fingers 24 meets the following condition:

$$1 \times pi \leq d \leq 4 \times pi$$

where pi is the period of the IDT 21. For d<1×pi, the SAW confining effect is weakened and the advantages resulting from the dummy electrode fingers 24 are not provided. For 4×pi<d, the electrode fingers 25 have an increased resistance and the insertion loss increases.

Figure 19:
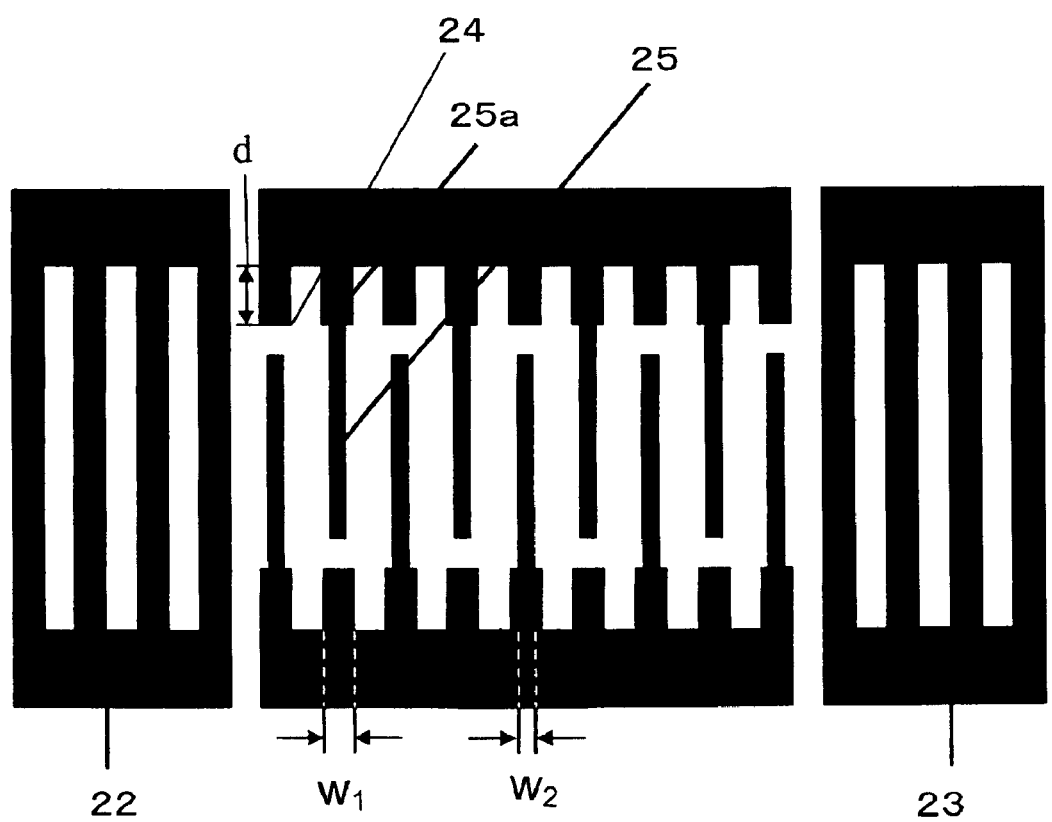
FIG. 19 illustrates a further structure of the one-port SAW resonator according to an embodiment of the present invention.

As shown in FIG. 19, the width $w_2$ of the excitation electrode fingers 25 may be made equal to the width $w_1$ of the dummy electrode fingers 24 at connecting portions in which the electrode fingers 25 are connected to the bus bars 26. The width of the dummy electrode fingers 24 is equal to that of the root portion of the electrode fingers 25. This arrangement develops the waveguide mode of SAW more effectively and reduces the resistance of the electrode fingers 25, so that the shoulder shape can further be improved.

Although not illustrated in FIGS. 18 and 19, the reflectors 22 and 23 may be varied so that the electrode fingers have root portions thicker than the remaining portions. This variation develops the waveguide mode of SAW even on the reflectors 22 and 23. This contributes to improvement in the shoulder shape.

Preferably, the piezoelectric substrates of the SAW resonators shown in FIGS. 13 through 19 are made of a piezoelectric single crystal such as 42° Y-cut X-propagation $LiTaO_3$.

Particularly, when the SAW resonators of the present invention are connected in series, drastic improvements in the shape factor can be provided. When the SAW resonator of the present invention is applied to a filter equipped with the SAW resonators such as the ladder-type SAW filter, it is possible to easily provide the filter with a higher shape factor and a broader pass-band width.

The SAW resonator of the present invention is suitably applied to not only the ladder type SAW filter but also the composite type SAW filter in which a one-port SAW resonator is combined with the double mode type SAW filter or a multi-electrode type SAW filter. In such applications, improvements in the shape factor as described before can be obtained similarly. The SAW resonator of the present invention can be applied to resonators of a wave separator such as an antenna duplexer.

Figure 20:
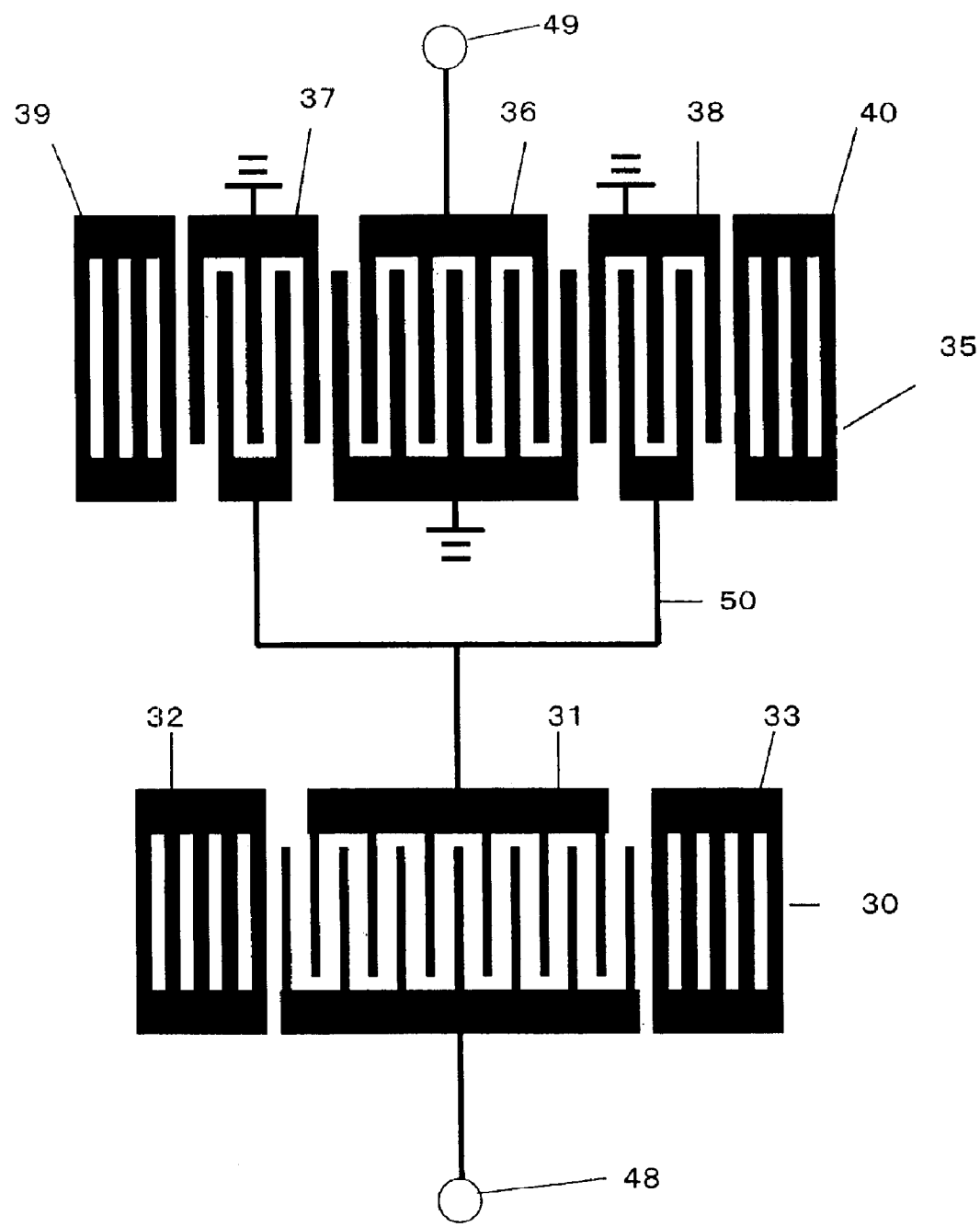
FIG. 20 illustrates a filter in which the one-port SAW resonator configured according to the present invention is connected to a dual mode SAW filter.

FIG. 20 shows a SAW filter in which a SAW resonator configured according to the present invention and a double mode type SAW filter are combined. More particularly, the SAW filter is a composite SAW filter that has a SAW filter 30 as shown in FIG. 13 and a double mode SAW (DMS) filter 35, which filters are cascaded in series. The DMS filter 35 has two modes, namely, the primary mode and the tertiary (third) mode, and has a high degree of suppression on the low-frequency side. The SAW resonator 30 is made up of the IDT 31 and the reflectors 32 and 33. The DMS filter 35 is made up of three IDTs 36, 37 and 38, and two reflectors 39 and 40. One of the pair of comb electrodes that form the IDT 37 and one of the pair of comb electrodes that form the IDT 38 are connected to one of the pair of comb electrodes that form the IDT 31 via a signal line 50. The other comb electrode of the IDT 31 is connected to a terminal 48 for making an external connection. The terminal 48 may serve as an input terminal. The other comb electrodes of the IDTs 37 and 38 are grounded. One of the pair of comb electrodes that form the IDT 36 is connected to a terminal for making an external connection, and the other comb electrode is grounded. The terminal 49 may serve as an output terminal.

Figure 21A:
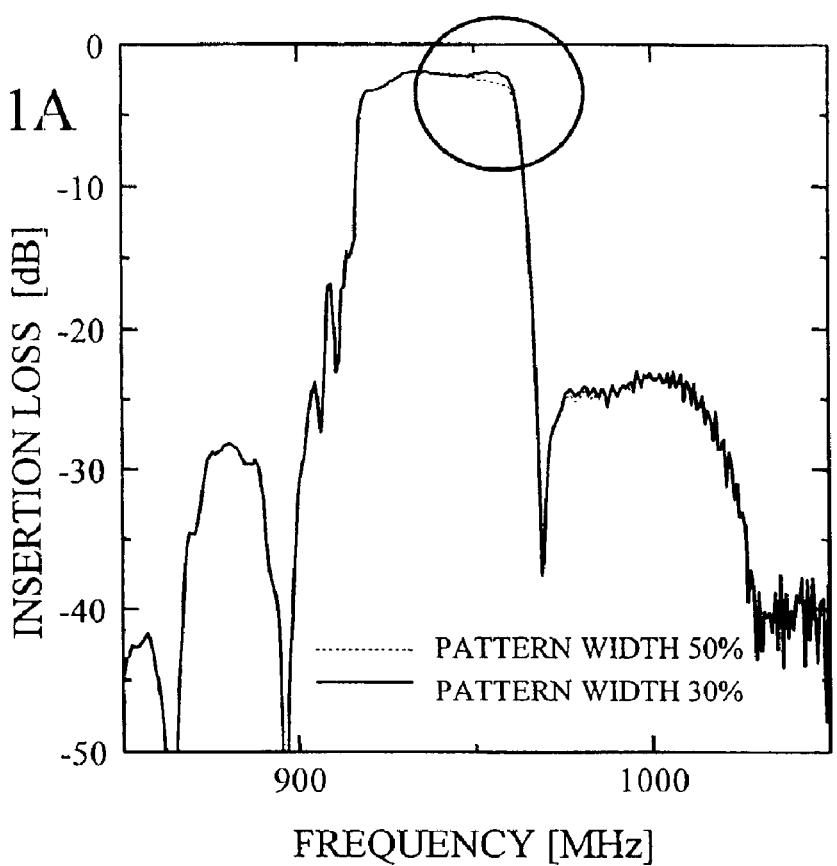
FIGS. 21A and 21B are graphs of frequency characteristics of two filters that are configured as shown in FIG. 20 and have different pattern widths.
Figure 21B:
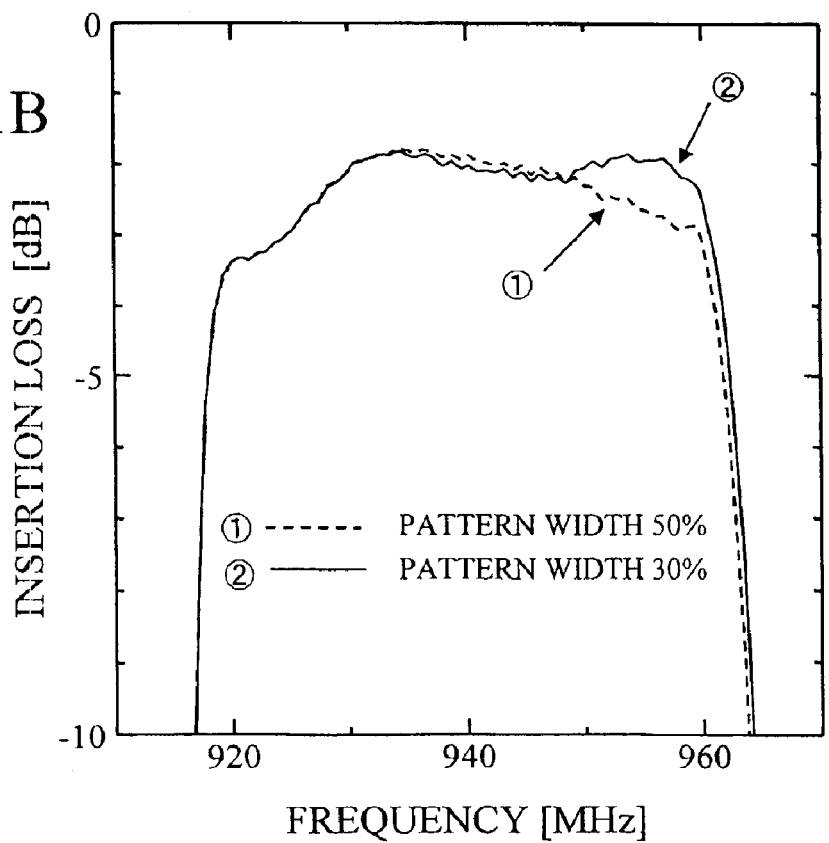

FIGS. 21A and 21B show filter characteristics of two SAW filters, each being configured as shown in FIG. 20. More particularly, FIG. 21B is an enlarged view of a portion surrounded with a circle shown in FIG. 21A. The IDTs 31 of the SAW resonators in the first and second SAW filters have pattern widths of 50% and 30%, respectively. The second SAW filter with the pattern width of the IDT 31 equal to 30% has a filter characteristic such that the sub peak is close to the resonance point and the high-frequency side of the pass band has a low insertion loss, as compared to the first SAW filter. That is, both the bass band characteristic and the shape factor are improved in the second SAW filter.

The way of connecting the SAW resonator 30 and the DMS filter 35 is not limited to that shown in FIG. 20. For instance, the comb electrode of the IDT 36 that is connected to the terminal 49 in FIG. 20 may be connected to the IDT 31. In this case, the signal line 50 is connected to the signal terminal 49 rather than the IDTs 37 and 38. The SAW resonators of the present invention may be connected to both terminals of the DMS filter 35. Also, some SAW resonators arranged in parallel arms may be added to any of the above-mentioned structures. The SAW resonator 30 may be any of the structures shown in FIGS. 14 through 19.

A description will now be given of some examples of the SAW filter according to the present invention.
(First Example)

The first example is a ladder type SAW filter of 800 MHz band in which only the SAW resonators arranged in the series arms are configured as shown in FIG. 13.

Figure 22:
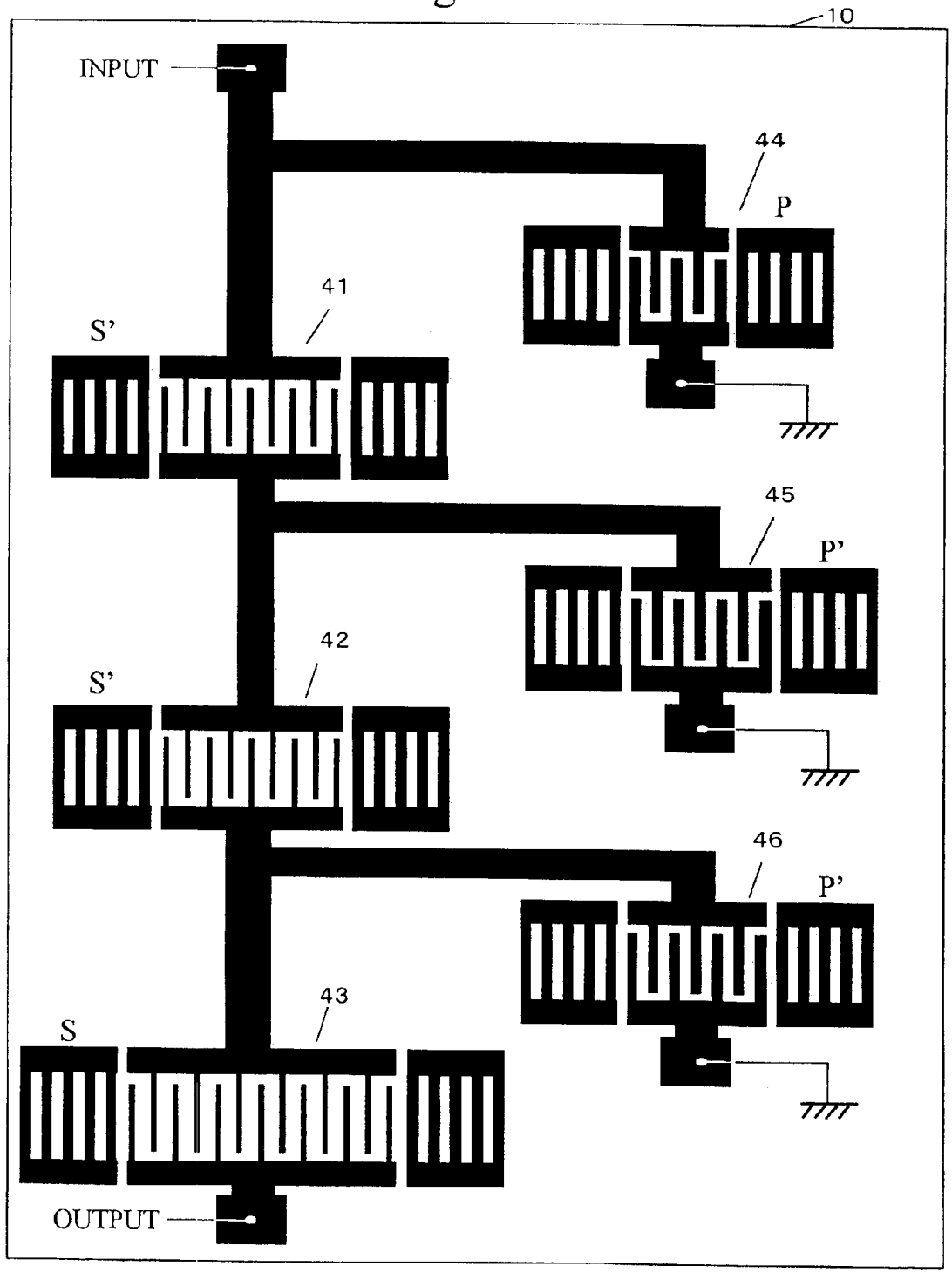
FIG. 22 illustrates a ladder type SAW filter according to a first example of the present invention.

Referring to FIG. 22, the first sample has the 42° Y-cut X-propagation $LiTaO_3$ substrate 10 on which three SAW resonators 41, 42 and 43 are arranged in series arms and three SAW resonators 44, 45 and 46 are arranged in parallel arms.

The SAW resonators 41 and 42 (symbol S' is added to for the conveniences' sake) are configured as shown in FIG. 13 and have the following specification: the period pi of IDT= 4.670 $\mu$m, the aperture length of IDT=62 $\mu$m, the number of pairs of IDT fingers=94, the pattern width of IDT=30%, the period pr of each reflector=2.825 $\mu$m, the number of fingers of each reflector=40, and the pattern width of each reflector= 60%.

The SAW resonator 43 (symbol S is added thereto) in the series arm is configured as shown in FIG. 13 and has the following specification: the period pi of IDT=4.670 $\mu$m, the aperture length of IDT=78 $\mu$m, the number of pairs of IDT fingers=151, the pattern width of IDT=30%, the period pr of each reflector=2.825 $\mu$m, the number of fingers of each reflector=20, and the pattern width of each reflector=60%.

Figure 1:
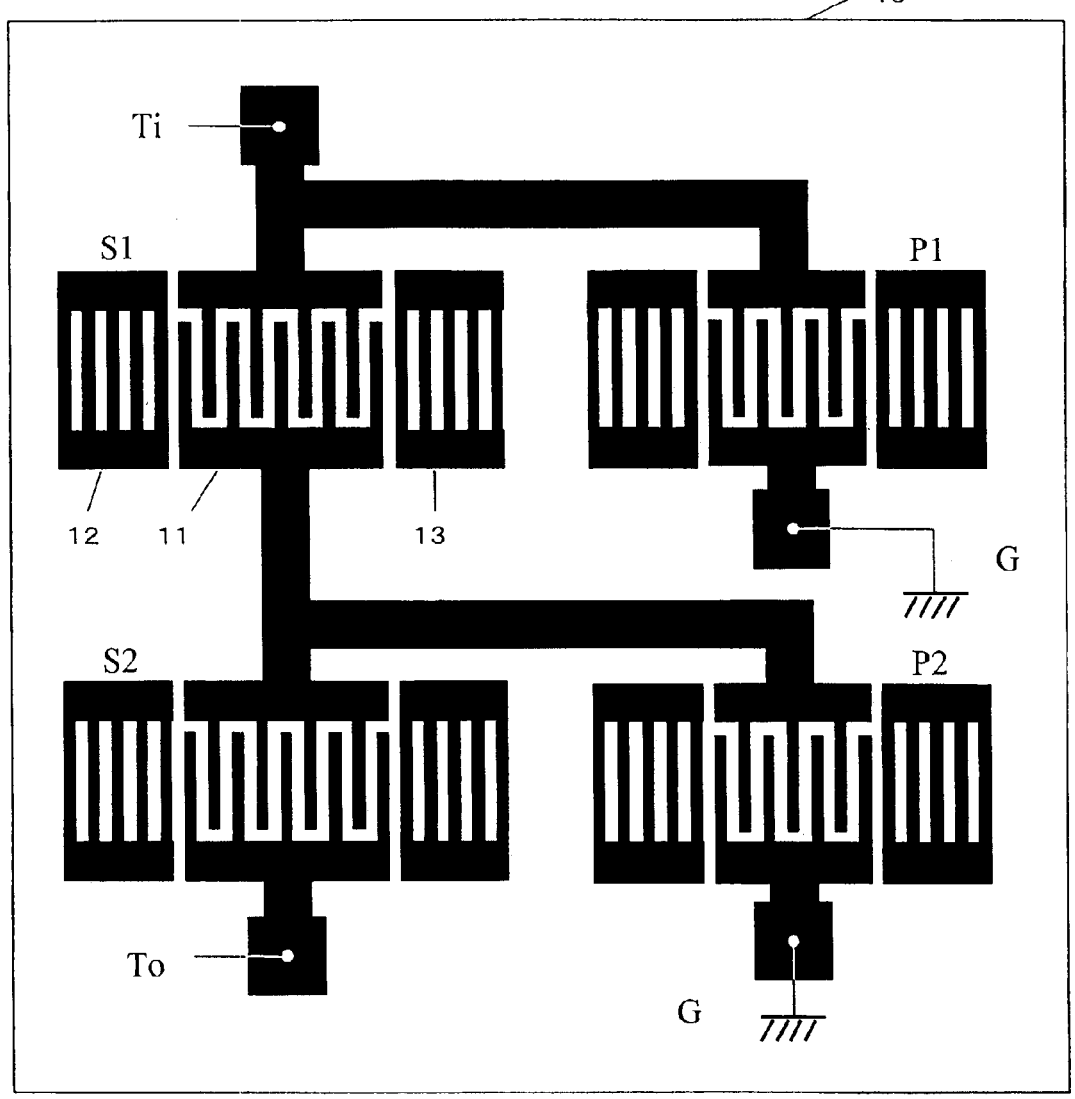
FIG. 1 is a plan view of a conventional ladder type SAW filter.
Figure 2:
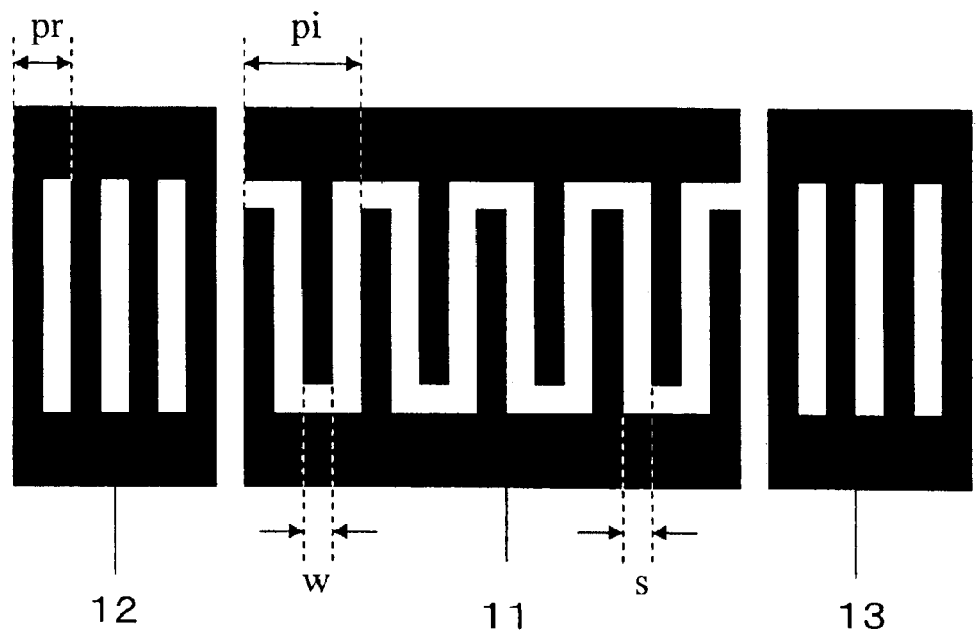
FIG. 2 is a view of a one-port SAW resonator.
Figure 3A:
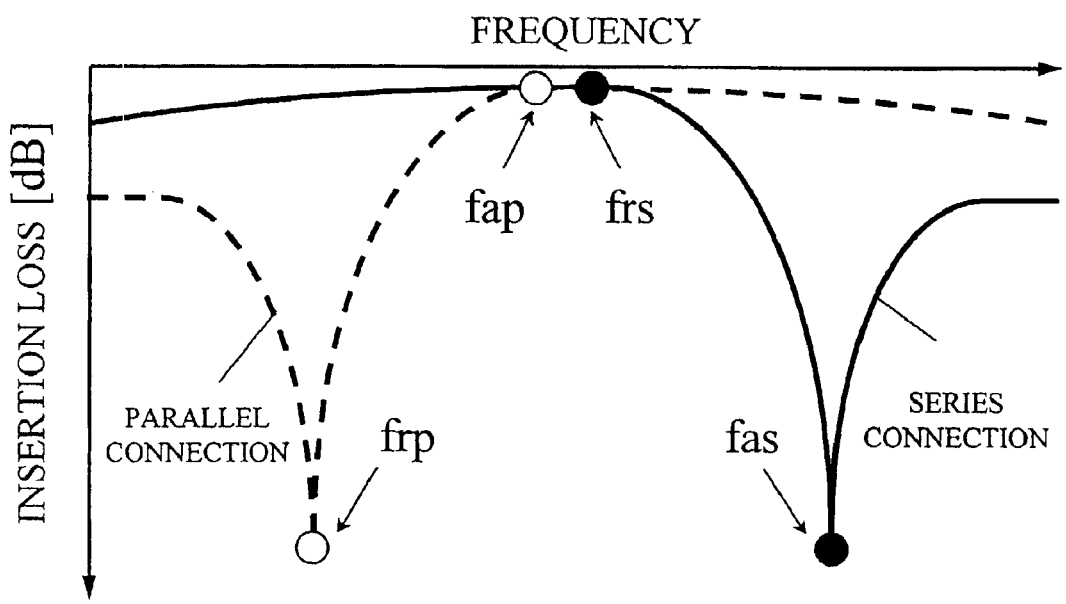
FIG. 3A is a graph of a frequency characteristic of the one-port SAW resonator.
Figure 3B:
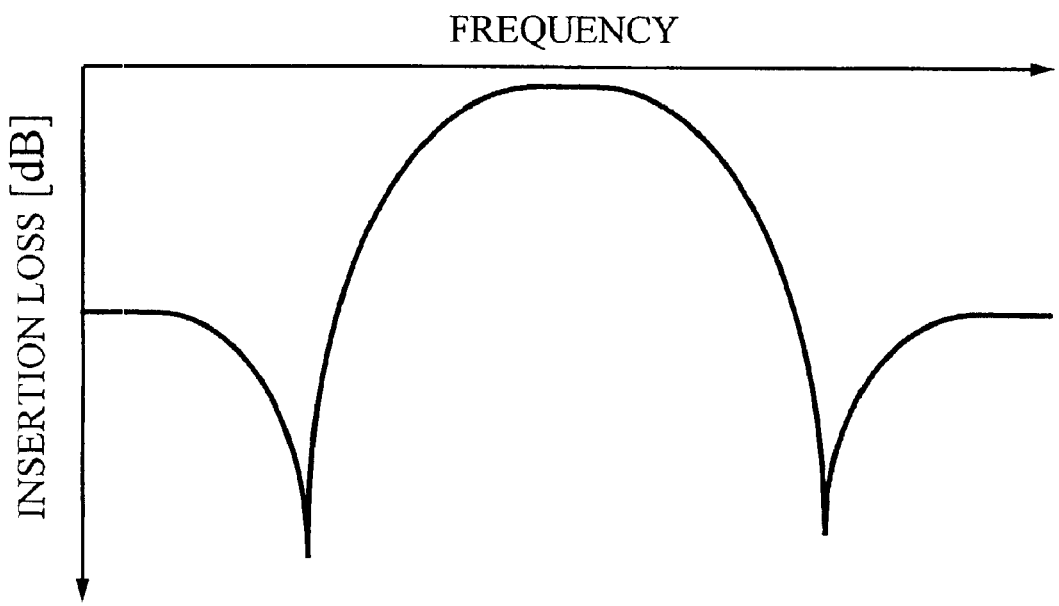
FIG. 3B is a graph of a frequency characteristic of a ladder type SAW filter.
Figure 4:
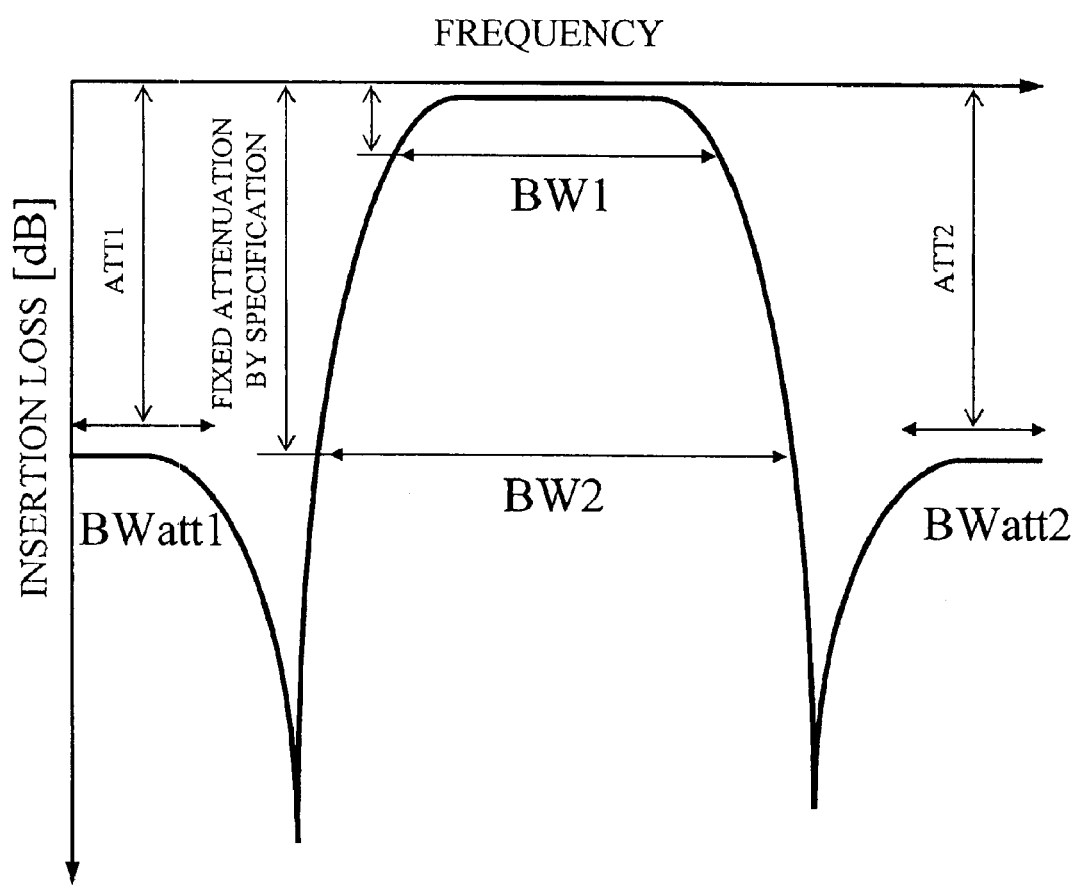
FIG. 4 is a graph of required band characteristics of a band-pass filter.
Figure 5:
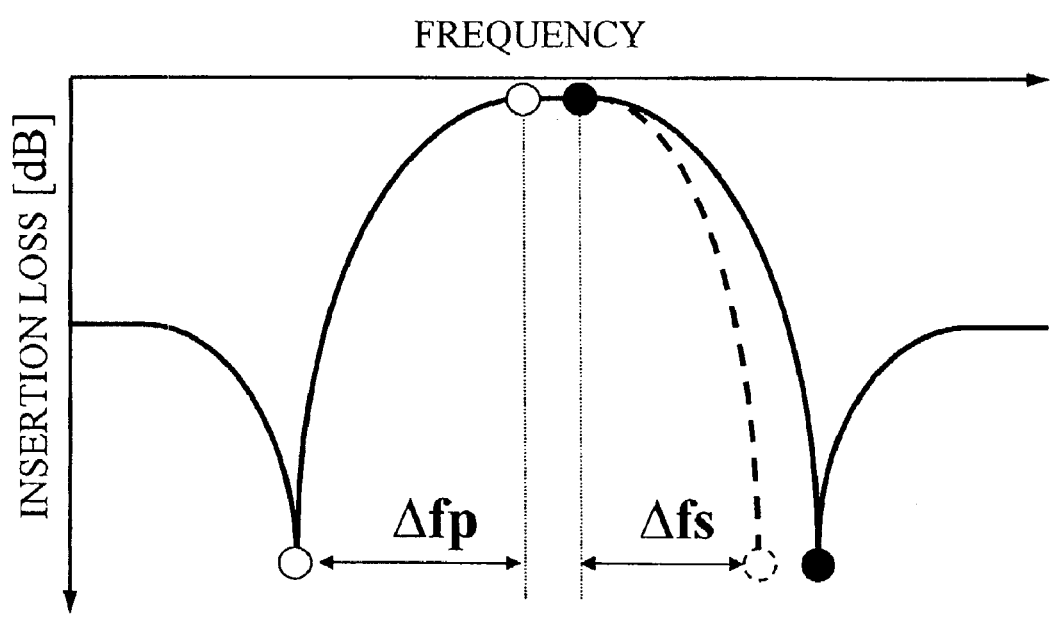
FIG. 5 is a graph illustrating an improvement of the shape factor due to reduction of a frequency difference Δf between the resonance frequency and the anti-resonance frequency.

The SAW resonators 45 and 46 arranged in the parallel arms (symbol P' is added thereto) are as shown in FIG. 2 and have the following specification: the period pi of IDT=4.790 $\mu$m, the aperture length of IDT=100 $\mu$m, the number of pairs of IDT fingers=121, the pattern width of IDT=60%, the period pr of each reflector=2.395 $\mu$m, the number of fingers of each reflector=40, and the pattern width of each reflector= 60%.

The SAW resonator 44 (symbol P is added thereto) in the parallel arm is configured as shown in FIG. 2, and has the following specification: the period pi of IDT=4.790 $\mu$m, the aperture length of IDT =80 $\mu$m, the number of pairs of IDT fingers=75, the pattern width of IDT=60%, the period pr of each reflector=2.395 $\mu$m, the number of fingers of each reflector=60, and the pattern width of each reflector=60%.

The SAW resonators 41–43 connected in series (arranged in the series arms) and the SAW resonators 44–46 connected in parallel (arranged in the parallel arms) are arranged in a zigzag formation. The SAW resonators 44–46 are arranged so as to avoid positions on imaginary lines continuous to the SAW propagation paths of the SAW resonators 41–43. Similarly, the SAW resonators 41–43 are arranged so as to avoid positions on imaginary lines continuous to the SAW propagation paths of the SAW resonators 44–46.

Figure 23:
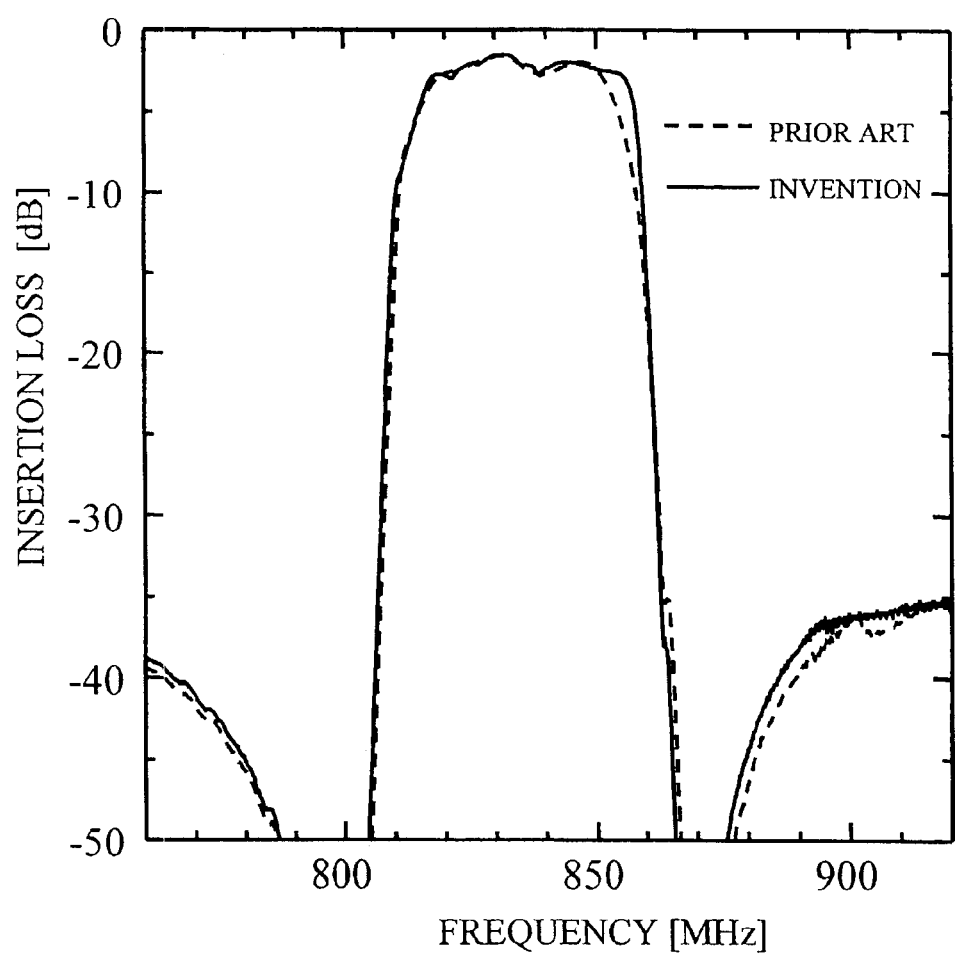
FIG. 23 is a graph of frequency characteristics of the ladder type SAW filter shown in FIG. 22 and the conventional ladder type SAW filter.

FIG. 23 shows frequency characteristics of the SAW filter of the first example and the conventional SAW filter equipped with only the conventional SAW filters as shown in FIG. 2. A solid line shows the frequency characteristic of the first example (shown as "Invention" in FIG. 23), and a broken line shows that of the conventional filter. It can be seen from the graph of FIG. 23 that the sub peak comes close to the resonance point in each series-arm SAW resonator and the right shoulder portion of the pass band has a lower insertion loss by setting the pattern width of the IDTs of the series-arm resonators equal to 30%. As a result, the pass-band width is broadened and the shape factor is drastically improved.
(Second Example)

The second example is a ladder type SAW filter of 1.9 GHz band wherein the SAW resonators arranged in the series arms are configured as shown in FIG. 18.

Figure 24:
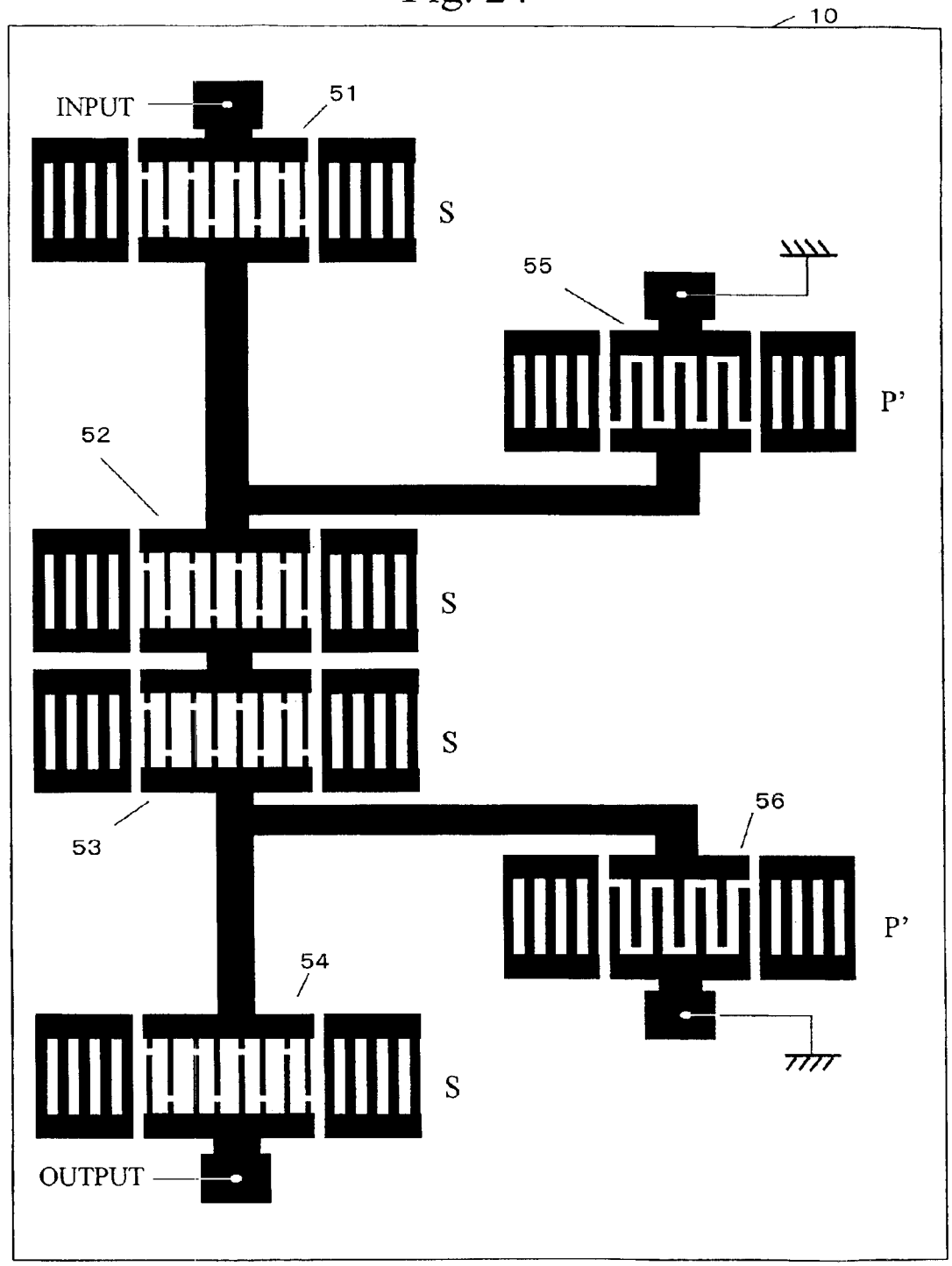
FIG. 24 illustrates a ladder type SAW filter according to a second example of the present invention.

Referring to FIG. 24, the second sample has the 42° Y-cut X-propagation $LiTaO_3$ substrate 10 on which three SAW resonators 51, 52 and 53 are arranged in series arms and two SAW resonators 55 and 56 are arranged in parallel arms.

The SAW resonators 51–54 in the series arms (symbol S is added thereto) are configured as shown in FIG. 18, and have the following specification: the period pi of IDT=2.115 µm, the aperture length of IDT=44 µm, the number of pairs of IDT fingers=161, the pattern width of IDT=35%, the period pr of each reflector=1.0575 µm, the number of fingers of each reflector=160, the pattern width of each reflector=50%, the length of the dummy electrode fingers 24 (FIG. 18)=2.115 µm, and the pattern width of the dummy electrode fingers 24=35%.

The SAW resonators 55 and 56 (symbol P' is added thereto) are configured as shown in FIG. 2 and have the following specification: the period pi of IDT=2.160 µm, the aperture length of IDT=60 µm, the number of pairs of IDT fingers=75, the pattern width of IDT=50%, the period pr of each reflector=1.080 µm, the number of fingers of each reflector=160, and the pattern width of each reflector=50%.

Figure 25:
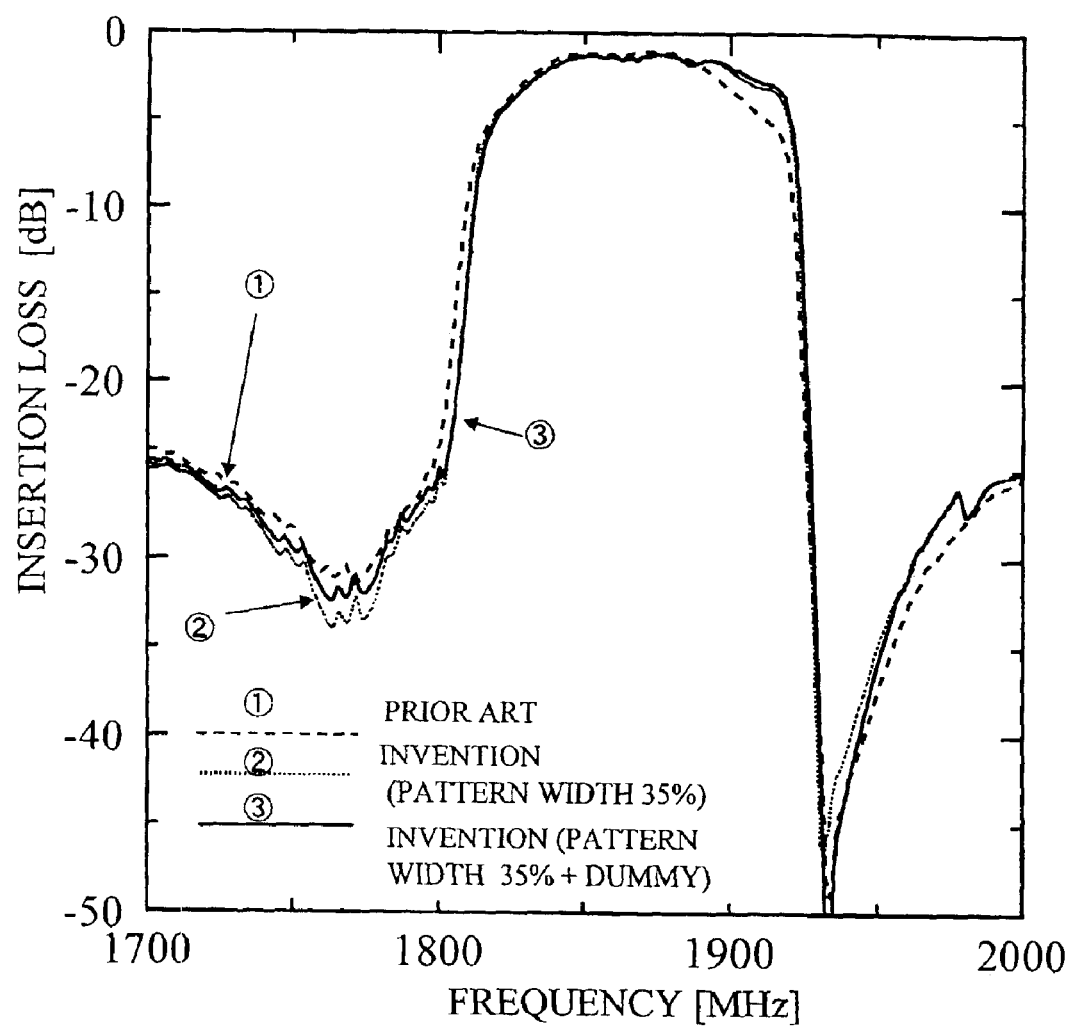
FIG. 25 is a graph of frequency characteristics of the ladder type SAW filter shown in FIG. 24 and the conventional ladder type SAW filter.

FIG. 25 shows frequency characteristics of the SAW filter of the second example and the conventional SAW filter equipped with only the conventional SAW filters as shown in FIG. 2. A dotted line indicated by ② shows the frequency characteristic of the second example with the pattern width equal to 35% in FIG. 25, and a broken line indicated by ① shows that of the conventional filter. A solid line indicated by ③ shows the frequency characteristic of the second example that has a pattern width of 35% and the dummy electrode fingers 24 added to the SAW resonators 51–54 in the series arms.

It can be seen from the graph of FIG. 25 that the sub peak comes close to the resonance point in each series-arm SAW resonator and the right shoulder portion of the pass band has a lower insertion loss by setting the pattern width of the IDTs of the series-arm resonators equal to 35%. Further, the dummy electrode fingers 24 added to the SAW resonators 51–54 in the series arms further improve the insertion loss of the right shoulder portion. As a result, the pass-band width is broadened and the shape factor is drastically improved.

The present invention is not limited to the specifically disclosed embodiments and variations, and other embodiments, variations and modifications may be made without departing from the scope of the present invention.

What is claimed is:

1. A ladder-type surface acoustic wave filter comprising:
   a piezoelectric substrate of $LiTaO_3$; and
   an acoustic wave (SAW) resonator having an interdigital transducer formed on the piezoelectric substrate,
   wherein the interdigital transducer satisfies:

$$0.15L \leq W \leq 0.45L$$

where W is the total of widths of all electrode fingers that form the interdigital transducer, and L is a length of the interdigital transducer in a direction of SAW propagation, wherein:
   the interdigital transducer has a single electrode arrangement; and
   a pattern width wa of the electrode fingers that form the interdigital transducer satisfies:

$$15\% \leq wa \leq 25\%.$$

2. The surface acoustic wave resonator as claimed in claim 1,
   wherein the interdigital transducer is formed by a metal film and has bus bars thicker than other portions of the interdigital transducer.

3. The ladder-type surface acoustic wave filter as claimed in claim 1,
   further comprising a dielectric film provided on bus bars of the interdigital transducer,
   wherein the interdigital transducer has a surface portion in the absence of the dielectric film.

4. The surface acoustic wave resonator as claimed in claim 1,
   further comprising a dielectric film provided on the interdigital transducer, wherein the dielectric film comprises a first portion that is provided on bus bars of the interdigital transducer and is thicker than a second portion provided on the electrode fingers.

5. The ladder-type surface acoustic wave filter according to claim 1, wherein the electrode fingers that form the interdigital transducer have an identical pattern width.

6. A surface acoustic wave resonator comprising:
   a piezoelectric substrate; and
   an acoustic wave (SAW) resonator having an interdigital transducer,
   wherein the interdigital transducer satisfies:

$$0.15L \leq W \leq 0.45L$$

where W is the total of widths of all electrode fingers that form the interdigital transducer, and L is a length of said at least one interdigital transducer in a direction of SAW propagation,
   wherein the electrode fingers that form the interdigital transducer have different pattern widths.

7. The surface acoustic wave resonator according to claim 6, further comprising reflectors arranged at both sides of the interdigital transducer.

8. The surface acoustic wave resonator according to claim 6, wherein the piezoelectric substrate is made of 42° Y-cut X-propagation $LiTaO_3$.

9. The surface acoustic wave resonator as claimed in claim 6, wherein the interdigital transducer is formed by a metal film and has bus bars thicker than other portions of the interdigital transducer.

10. The surface acoustic wave resonator as claimed in claim 6, further comprising a dielectric film provided on bus bars of the interdigital transducer;
    wherein the interdigital transducer has a surface portion in the absence of the dielectric film.

11. The surface acoustic wave resonator as claimed in claim 6, further comprising a dielectric film provided on the interdigital transducer, wherein the dielectric film comprises a first portion that is provided on bus bars of the interdigital transducer and is thicker than a second portion provided on the electrode finger.

12. A surface acoustic wave resonator comprising:
    a piezoelectric substrate; and
    an acoustic wave (SAW) resonator having an interdigital transducer,
    wherein the interdigital transducer satisfies:

$$0.15L \leq W \leq 0.45L$$

where W is the total of widths of all electrode fingers that form the interdigital transducer, and L is a length of the interdigital transducer in a direction of SAW propagation,
    the surface acoustic wave resonator further comprising dummy electrode fingers provided so as to face ends of the electrode fingers of the interdigital transducer, wherein the dummy electrode fingers have a pattern width wd that satisfies:

$$wa \leq wd \leq 70\%$$

where wa is a pattern width of the electrode fingers involved in SAW excitation.

13. A surface acoustic wave resonator comprising:

a piezoelectric substrate; and an acoustic wave (SAW) resonator having an interdigital transducer, wherein the interdigital transducer satisfies:

$$0.15L \leq W \leq 0.45L$$

where W is the total of widths of all electrode fingers that form the interdigital transducer, and L is a length of the interdigital transducer in a direction of SAW propagation, the surface acoustic wave resonator further comprising dummy electrode fingers provided so as to face ends of the electrode fingers of the interdigital transducer, wherein the dummy electrode fingers have a length d that satisfies:

$$1 \times pi \leq d \leq 4 \times pi$$

where pi is one period of the interdigital transducer.

14. A ladder-type surface acoustic wave filter comprising:

a piezoelectric substrate of LiTaO$_3$; and an acoustic wave (SAW) resonator having an interdigital transducer formed on the piezoelectric substrate, wherein the interdigital transducer satisfies:

$$0.15L \leq W \leq 0.45L$$

where W is the total of widths of all electrode fingers that form the interdigital transducer, and L is a length of the interdigital transducer in a direction of SAW propagation, further comprising dummy electrode fingers provided so as to face ends of the electrode fingers of the interdigital transducer.

15. A ladder-type surface acoustic wave filter comprising:

a piezoelectric substrate of LiTaO$_3$; and surface acoustic wave (SAW) resonators that are formed on the piezoelectric substrate and are electrically connected in series, each of the SAW resonators having an interdigital transducer that satisfies:

$$0.15L \leq W \leq 0.45L$$

where W is the total of widths of all electrode fingers that form the interdigital transducer, and L is a length of the interdigital transducer in a direction of SAW propagation.

16. A ladder-type surface acoustic wave filter comprising:

a piezoelectric substrate of LiTaO$_3$; and surface acoustic wave (SAW) resonators that are formed on the piezoelectric substrate and are electrically connected in series, the SAW resonators including a SAW resonator having an interdigital transducer that satisfies:

$$0.15L \leq W \leq 0.45L$$

where W is the total of widths of all electrode fingers that form the interdigital transducer, and L is a length of the interdigital transducer in a direction of SAW propagation.

17. A surface acoustic wave filter comprising:

a double mode type surface acoustic wave (SAW) filter and a ladder-type SAW filter electrically connected thereto, said ladder-type SAW filter comprising a piezoelectric substrate of LiTaO$_3$; and an acoustic wave (SAW) resonator having an interdigital transducer formed on the piezoelectric substrate, wherein said at least one interdigital transducer satisfies:

$$0.15L \leq W \leq 0.45L$$

wherein W is the total of widths of all electrode fingers that form the interdigital transducer, and L is a length of the interdigital transducer in a direction of SAW propagation.

* * * * *